United States Patent
Kotani et al.

(10) Patent No.: US 10,651,305 B2
(45) Date of Patent: May 12, 2020

(54) COMPOUND SEMICONDUCTOR DEVICE WITH QUANTUM WELL STRUCTURE, POWER SUPPLY DEVICE, AND HIGH-FREQUENCY AMPLIFIER

(71) Applicant: FUJITSU LIMITED, Kawasaki-shi, Kanagawa (JP)

(72) Inventors: Junji Kotani, Atsugi (JP); Norikazu Nakamura, Sagamihara (JP); Hisao Shigematsu, Zama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/045,960

(22) Filed: Jul. 26, 2018

(65) Prior Publication Data
US 2019/0043976 A1 Feb. 7, 2019

(30) Foreign Application Priority Data
Aug. 4, 2017 (JP) .................. 2017-151728

(51) Int. Cl.
*H01L 29/778* (2006.01)
*H01L 29/205* (2006.01)
(Continued)

(52) U.S. Cl.
CPC .... *H01L 29/7783* (2013.01); *H01L 21/02178* (2013.01); *H01L 21/02271* (2013.01);
(Continued)

(58) Field of Classification Search
CPC ......... H01L 21/02178; H01L 21/02271; H01L 21/0262; H01L 21/28264; H01L 21/28575; H01L 29/1029; H01L 29/155; H01L 29/205; H01L 29/401; H01L 29/452; H01L 29/36; H01L 29/4958; H01L 29/66462; H01L 29/7783; H03F 1/3205; H03F 1/3241; H03F 1/3247; H03F 3/193; H03F 3/195; H03F 3/21; H03F 3/245; H02M 1/4208; H02M 1/4225; H02M 3/33576; H02M 2001/007
See application file for complete search history.

(56) References Cited

U.S. PATENT DOCUMENTS

| 4,827,320 A * | 5/1989 | Morkoc ............... H01L 29/205 257/18 |
| 5,285,087 A * | 2/1994 | Narita ................ H01L 29/7783 257/190 |
| 7,928,427 B1 * | 4/2011 | Chang ................ H01L 21/8258 257/24 |

OTHER PUBLICATIONS

Teke et al. "The effect of AlN interlayer thicknesses on scattering processes in lattice-matched AlInN/GaN two-dimensional electron gas heterostructures", New Journal of Physics 11, 2009, 063031, Published Jun. 16, 2009 (13 pages).
(Continued)

*Primary Examiner* — Andrew Q Tran
(74) *Attorney, Agent, or Firm* — Westerman, Hattori, Daniels & Adrian, LLP

(57) ABSTRACT

A compound semiconductor device includes a substrate, a compound semiconductor layer formed over the substrate, a channel layer formed over the compound semiconductor layer, an electron supply layer formed over the channel layer, and a source electrode, a drain electrode, and a gate electrode that are formed apart from each other over the electron supply layer. A quantum well structure is formed by the compound semiconductor layer, the channel layer, and the electron supply layer.

13 Claims, 26 Drawing Sheets

(51) Int. Cl.
*H03F 3/193* (2006.01)
*H01L 29/10* (2006.01)
*H01L 29/66* (2006.01)
*H01L 21/285* (2006.01)
*H01L 29/45* (2006.01)
*H01L 21/02* (2006.01)
*H01L 29/49* (2006.01)
*H01L 29/40* (2006.01)
*H03F 3/21* (2006.01)
*H03F 1/32* (2006.01)
*H02M 1/42* (2007.01)
*H01L 29/15* (2006.01)
*H03F 3/24* (2006.01)
*H03F 3/195* (2006.01)
*H01L 29/36* (2006.01)
*H01L 29/20* (2006.01)
*H01L 21/28* (2006.01)
*H02M 3/335* (2006.01)
*H02M 1/00* (2006.01)
*H01L 29/08* (2006.01)
*H01L 21/24* (2006.01)

(52) U.S. Cl.
CPC .... *H01L 21/28575* (2013.01); *H01L 29/1029* (2013.01); *H01L 29/155* (2013.01); *H01L 29/205* (2013.01); *H01L 29/401* (2013.01); *H01L 29/452* (2013.01); *H01L 29/4958* (2013.01); *H01L 29/66462* (2013.01); *H02M 1/4208* (2013.01); *H03F 1/3205* (2013.01); *H03F 1/3241* (2013.01); *H03F 1/3247* (2013.01); *H03F 3/193* (2013.01); *H03F 3/195* (2013.01); *H03F 3/21* (2013.01); *H03F 3/245* (2013.01); *H01L 21/0254* (2013.01); *H01L 21/0262* (2013.01); *H01L 21/02458* (2013.01); *H01L 21/02576* (2013.01); *H01L 21/246* (2013.01); *H01L 21/28264* (2013.01); *H01L 29/0843* (2013.01); *H01L 29/2003* (2013.01); *H01L 29/36* (2013.01); *H02M 1/4225* (2013.01); *H02M 3/33576* (2013.01); *H02M 2001/007* (2013.01)

(56) References Cited

OTHER PUBLICATIONS

Gurusinghe et al., "Two-dimensional electron mobility limitation mechanisms in $Al_xGa_{1-x}N/GaN$ heterostructures", Physical Review B 72, 045316, 2005, pp. 045316-1-11, (11 pages).

\* cited by examiner

COMPOUND SEMICONDUCTOR DEVICE WITH QUANTUM WELL STRUCTURE, POWER SUPPLY DEVICE, AND HIGH-FREQUENCY AMPLIFIER

CROSS-REFERENCE TO RELATED APPLICATION

The present application is based upon and claims the benefit of priority of Japanese Patent Application No. 2017-151728 filed on Aug. 4, 2017, the entire contents of which are incorporated herein by reference.

FIELD

An aspect of this disclosure relates to a compound semiconductor device, a power supply device, a high-frequency amplifier, and a method for manufacturing the compound semiconductor device.

BACKGROUND

Various types of compound semiconductor devices are known. Among them, a high electron mobility transistor (HEMT) produces less noise and can operate at high speed, and is used in base stations for cellphones because of these characteristics.

In a HEMT, two dimensional electron gas is generated in a channel layer due to a difference in spontaneous polarization between the channel layer and an electron supply layer disposed over the channel layer. It is supposed that the power of a HEMT can be increased by increasing the density of the two dimensional electron gas.

However, it has been reported that the electron mobility decreases when the density of two dimensional electron gas is increased. Accordingly, it is difficult to increase the power of a HEMT by increasing the density of two dimensional electron gas (see, for example, M. N. Gurusinghe et al., "Two-dimensional electron mobility limitation mechanisms in AlxGa1-xN/GaN heterostructure", Physical Review B 72, 045316 (2005)).

SUMMARY

According to an aspect of this disclosure, there is provided a compound semiconductor device that includes a substrate, a compound semiconductor layer formed over the substrate, a channel layer formed over the compound semiconductor layer, an electron supply layer formed over the channel layer, and a source electrode, a drain electrode, and a gate electrode that are formed apart from each other over the electron supply layer. A quantum well structure is formed by the compound semiconductor layer, the channel layer, and the electron supply layer.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Before describing embodiments of the present invention, a study conducted by the inventors of the present invention is described.

Methods for increasing the power of a HEMT include, in addition to the above-described method where the density of two dimensional electron gas is increased, a method where the electron velocity in two dimensional electron gas is increased.

The inventors conducted a study on factors that prevent increase in the electron velocity in a HEMT.

Figure 1:
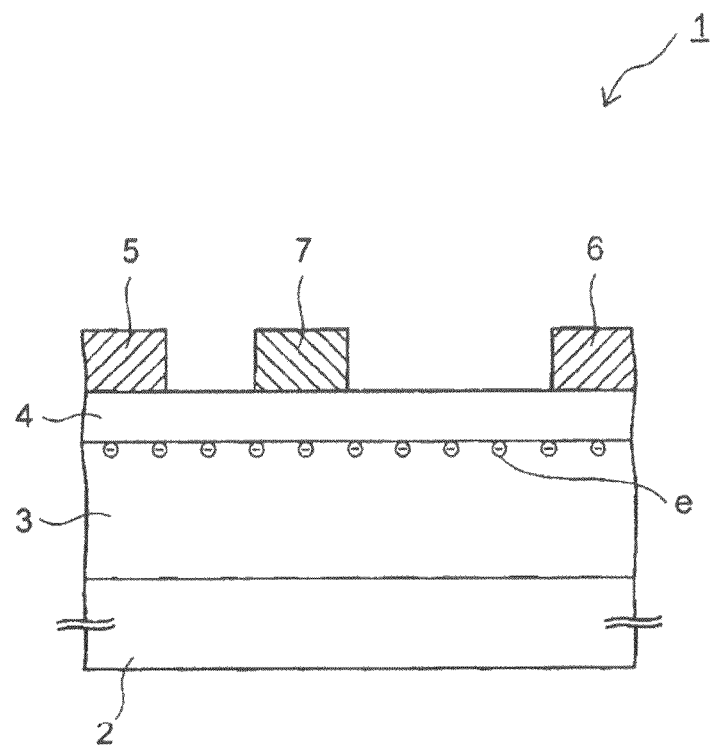
FIG. 1 is a cross-sectional view of a compound semiconductor device used for a study.

FIG. 1 is a cross-sectional view of a compound semiconductor device 1 used for the study.

The compound semiconductor device 1 is a HEMT and includes an SiC substrate 2 and a channel layer 3 formed over the SiC substrate 2.

In this example, the channel layer 3 is implemented by a GaN layer. However, the material of the channel layer 3 is not limited to GaN. The band gap of GaN is 3.4 eV, which is greater than the band gap (1.1 eV) of silicon and the band gap (1.4 eV) of GaAs. Accordingly, using a GaN layer as the channel layer 3 makes it possible to provide a high-voltage, high-power HEMT.

An AlGaN layer is formed as an electron supply layer 4 over the channel layer 3. Two dimensional electron gas "e" is generated in the channel layer 3 because of differences in lattice constant and spontaneous polarization between the electron supply layer 4 and the channel layer 3.

Also, a source electrode 5, a drain electrode 6, and a gate electrode 7 are formed at intervals over the electron supply layer 4.

With the compound semiconductor device 1 configured as described above, because the two dimensional electron gas "e" is generated in the channel layer 3 including no impurity, electrons are supposed to be able to move at high speed in the channel layer 3 without being affected by impurity scattering.

However, as described below, the inventors have found that the electron velocity is saturated when the drain voltage applied between the source electrode 5 and the drain electrode 6 is increased.

Figure 2:
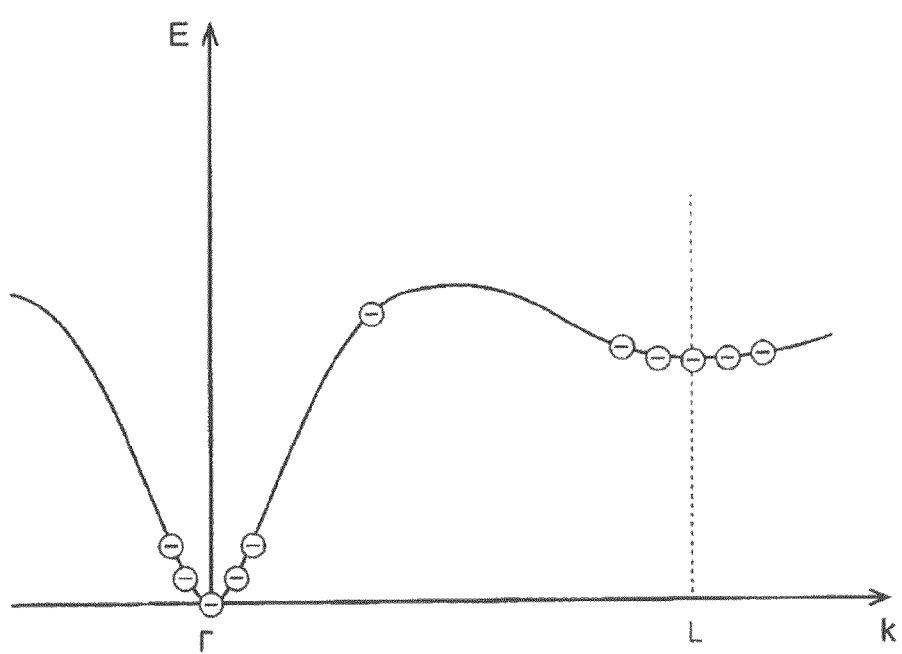
FIG. 2 is a graph illustrating an E–k dispersion relation of electrons in a channel layer of the compound semiconductor device used for the study.

FIG. 2 is a graph illustrating an E-k (energy-wave number) dispersion relation of electrons in the channel layer 3.

In the graph of FIG. 2, there are two local minimum points: a point $\Gamma$ and a point L.

The point $\Gamma$ is a local minimum point observed when the wave number k is zero. The point L is a local minimum point observed when the wave number k is greater than zero.

As in this example, when the channel layer 3 is implemented by a GaN layer, the lower end of the conduction band exists at the point $\Gamma$, and the second valley exists at the point L. Also, the energy at the point L is greater than the energy at the point $\Gamma$ by about 1 eV.

When $E_k$ indicates the energy of an electron with the wave number k, effective mass m* and mean velocity v of the electron are represented by formulas (1) and (2) below.

$$\frac{1}{m^*} = \frac{1}{\hbar^2} \frac{\partial^2 E_k}{\partial k^2} \quad (1)$$

$$v = \frac{1}{\hbar} \frac{\partial E_k}{\partial k^2} \quad (2)$$

According to formula (1), the effective mass m* decreases as the curvature ($\partial^2 E_k/\partial k^2$) of the graph increases, and the electron is quickly accelerated.

According to formula (2), the mean velocity v of the electron increases as the slope ($\partial E_k/\partial k$) of the graph increases.

An electron in a thermal equilibrium state is in a low energy state and therefore exists near the point $\Gamma$. When a high voltage is applied to the electron, the electron crosses a barrier between the point $\Gamma$ and the point L due to energy from an electric field and transitions to the point L.

As illustrated in FIG. 2, the curvature and the slope of the graph at the point L are smaller than those at the point $\Gamma$. Therefore, the velocity of the electron transitioned to the point L does not increase even if a high electric field is applied to the electron.

For the above reason, with the compound semiconductor device 1, the electron velocity does not sufficiently increase even if the drain voltage is increased. If the electron velocity does not increase, the operation speed of the HEMT does not increase, and also the power of the HEMT does not increase because the drain current defined by the number of electrons flowing per unit time cannot be increased.

When a compound semiconductor layer such as an AlInN layer including In is formed as the electron supply layer 4 to increase the concentration of the two dimensional electron gas "e", electric field concentration tends to occur at an edge of the gate electrode 7 closer to the drain electrode 6 due to the high-concentration two dimensional electron gas "e". As a result, electrons acquire high energy from the high electric field and transition to the point L, the effective mass of the electrons increases, and the electron velocity considerably decreases.

An aspect of this disclosure makes it possible to provide a high-power compound semiconductor device without increasing the density of two dimensional electron gas, and makes it possible to provide a method of manufacturing the compound semiconductor device, a power supply device, and a high-frequency amplifier.

Embodiments of the present invention are described below with reference to the accompanying drawings.

<First Embodiment>

A compound semiconductor device and a process of manufacturing the compound semiconductor device according to a first embodiment are described below.

FIGS. 3A through 5 are drawings illustrating a process of manufacturing the compound semiconductor device according to the first embodiment. In the first embodiment, a HEMT is used as an example of the compound semiconductor device.

Figure 3A:
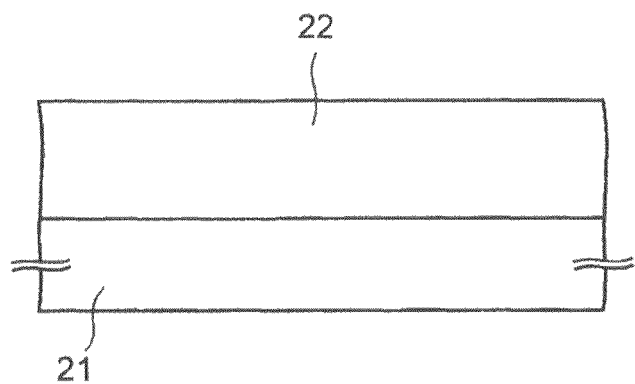
FIGS. 3A and 3B are drawings illustrating a part of a process of manufacturing a compound semiconductor device according to a first embodiment.

First, as illustrated in FIG. 3A, an AlN substrate is prepared as a substrate 21, and an $Al_xGa_{1-x}N$ (0<x≤1) layer with a thickness of about 500 nm is formed as a buffer layer 22 over the substrate 21 by metal organic chemical vapor deposition (MOCVD). The buffer layer 22 is an example of a compound semiconductor layer.

Instead of an AlN substrate, the substrate 21 may be implemented by a silicon substrate, an SiC substrate, a sapphire substrate, or a GaN substrate.

Any appropriate film-forming conditions may be used to form the buffer layer 22. In the first embodiment, a trimethylaluminum (TMA) gas is used as a source gas for aluminum, and a trimethylgallium (TMG) gas is used as a source gas for gallium.

The buffer layer 22 is formed by increasing the substrate temperature to 1400° C. or higher while supplying a mixed gas of the TMG gas, the TMA gas, and an ammonia ($NH_3$) gas as a film-forming gas. The flow rate of the ammonia gas in the film-forming gas is between about 100 ccm and about 10 LM, and the pressure in the chamber is between about 50 Torr and about 300 Torr.

The composition ratio x of Al in the buffer layer 22 can be controlled by adjusting the flow ratio of the TMA gas in the film-forming gas. An AlN layer may instead be formed as the buffer layer 22 by not adding the TMG gas to the film-forming gas.

Figure 3B:
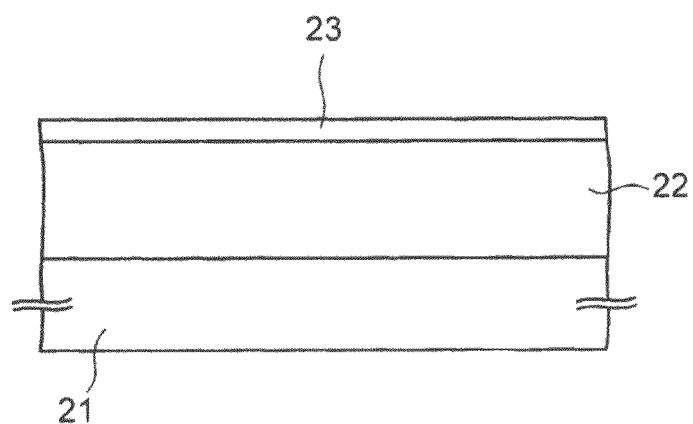

Next, as illustrated in FIG. 3B, a GaN layer is formed as a channel layer 23 over the buffer layer 22 at a substrate temperature between about 700° C. and about 1200° C. using the same chamber where the buffer layer 22 is formed.

In this example, the channel layer 23 with a thickness of less than or equal to 15 nm (e.g., about 10 nm) is formed by maintaining the pressure in the chamber between about 50 Torr and about 300 Torr and using a mixed gas of the TMG gas and the ammonia gas as a film-forming gas.

Figure 4A:
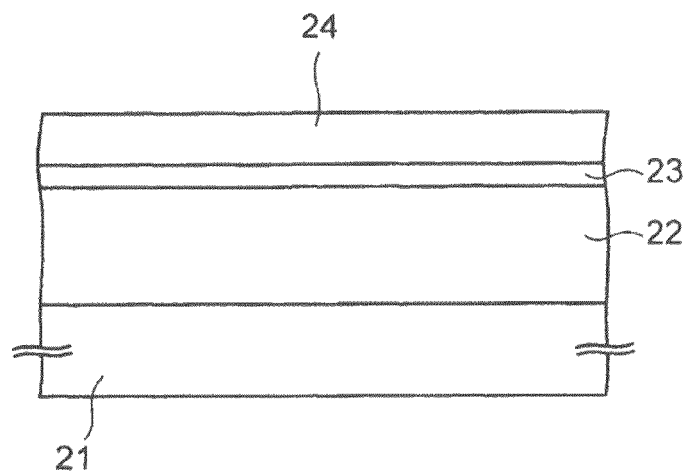
FIGS. 4A and 4B are drawings illustrating a part of the process of manufacturing the compound semiconductor device according to the first embodiment.

Next, as illustrated in FIG. 4A, an $Al_yGa_{1-y}N$ (0<y≤1) layer with a thickness of about 10 nm is formed as an electron supply layer 24 over the channel layer 23 by MOCVD using the same chamber.

Similarly to the buffer layer 22, a mixed gas of the TMG gas, the TMA gas, and the ammonia gas is used as a film-forming gas for the electron supply layer 24. Also, the pressure in the chamber is set between about 50 Torr and about 300 Torr, and the substrate temperature is set greater than or equal to 1,400° C.

The flow rate of the ammonia gas in the film-forming gas is between about 100 ccm and about 10 LM, and the composition ratio y of Al in the electron supply layer 24 is controlled by adjusting the flow ratio of the TMA gas in the film-forming gas.

An AlN layer may instead be formed as the electron supply layer 24 by not adding the TMG gas to the film-forming gas.

Also, an $Al_zGa_{1-z}N$ (y<z) layer may be formed as a spacer layer on the channel layer 23, and the electron supply layer 24 may be formed on the spacer layer.

Although the buffer layer 22, the channel layer 23, and the electron supply layer 24 are formed by MOCVD in the above example, these layers may instead be formed by molecular beam epitaxy (MBE).

Figure 4B:
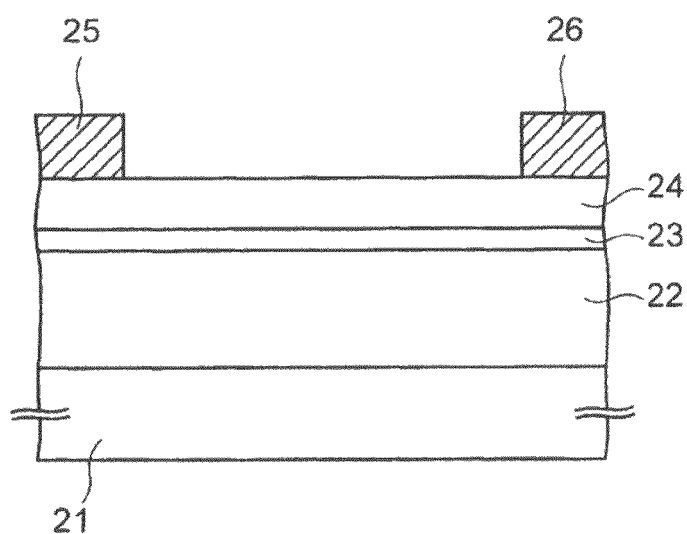

Next, as illustrated in FIG. 4B, a titanium layer and an aluminum layer are formed in this order by vapor deposition over the electron supply layer 24, and the resulting multilayer film is patterned by a lift-off technique to form a source electrode 25 and a drain electrode 26 disposed apart from each other.

Then, the source electrode 25 and the drain electrode 26 are heated in a nitrogen atmosphere at a substrate temperature between about 400° C. and about 1000° C. As a result, materials of the source electrode 25 and the drain electrode 26 diffuse into the electron supply layer 24, and an ohmic contact is formed between each of the source electrode 25 and the drain electrode 26 and the electron supply layer 24.

Also, a GaN layer with a thickness of about 4 nm may be formed as a cap layer on the electron supply layer 24, and the source electrode 25 and the drain electrode 26 may be formed on the cap layer.

Figure 5:
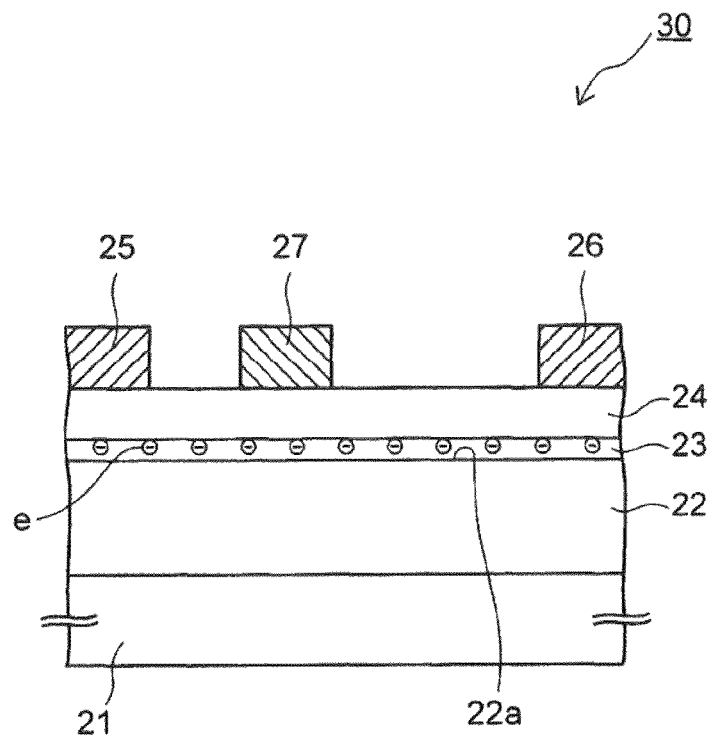
FIG. 5 is a drawing illustrating a part of the process of manufacturing the compound semiconductor device according to the first embodiment.

Next, as illustrated in FIG. 5, a nickel layer and a gold layer are formed in this order by vapor deposition over the electron supply layer 24, the source electrode 25, and the drain electrode 26, and the resulting multilayer film is patterned by a lift-off technique to form a gate electrode 27 on the electron supply layer 24 between the source electrode 25 and the drain electrode 26.

Through the above process, the basic structure of a compound semiconductor device 30 of the first embodiment is formed.

In the compound semiconductor device 30, positive charge appears at an interface between the channel layer 23 and the electron supply layer 24 due to a difference in spontaneous polarization between the channel layer 23 and the electron supply layer 24. The positive charge induces two dimensional electron gas "e" in the channel layer 23, which functions as a carrier of the transistor.

The density of the two dimensional electron gas "e" can be adjusted by adjusting the composition ratios x and y of aluminum in $Al_xGa_{1-x}N$ of the buffer layer 22 and $Al_yGa_{1-y}N$ of the electron supply layer 24. For example, when the composition ratio y is made greater than the composition ratio x (x<y), the spontaneous polarization of the buffer layer 22 becomes smaller than the spontaneous polarization of the electron supply layer 24, and the amount of negative charge induced on a surface 22a by the spontaneous polarization of the buffer layer 22 is reduced. This in turn prevents the negative charge on the surface 22a from inhibiting the generation of the two dimensional electron gas "e" and makes it possible to increase the density of the two dimensional electron gas "e".

Figure 6:
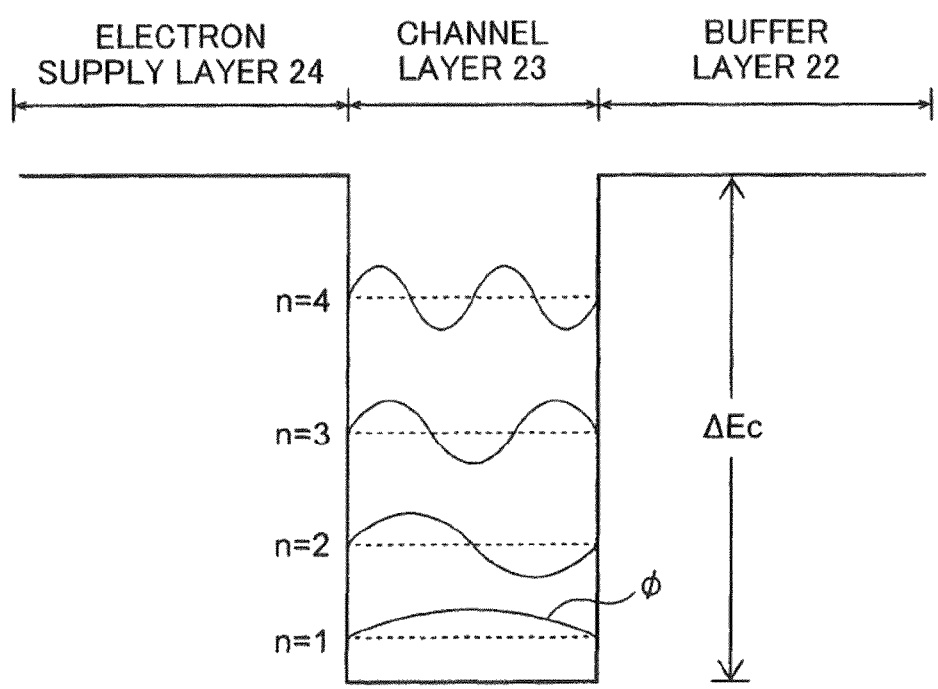
FIG. 6 is a drawing illustrating energy bands and electron wave functions in an area around a channel layer of the compound semiconductor device according to the first embodiment.

FIG. 6 is a drawing illustrating energy bands and electron wave functions p in an area around the channel layer 23.

The band gap of the channel layer 23 is narrower than those of the buffer layer 22 and the electron supply layer 24. Therefore, a quantum well structure, in which the channel layer 23 is the well layer, is formed by the buffer layer 22, the channel layer 23, and the electron supply layer 24, and the two dimensional electron gas "e" is confined in the channel layer 23.

The energy band of GaN forming the channel layer 23 is sufficiently narrower than the energy band of AlGaN forming the buffer layer 22 and the electron supply layer 24. Accordingly, a band offset ΔEc between the channel layer 23 and the electron supply layer 24 and a band offset ΔEc between the channel layer 23 and the buffer layer 22 become about 2 eV, which is sufficiently large, and the effect of confining electrons in the channel layer 23 is increased.

When electrons are confined in the channel layer 23 as described above, energy levels $E_n$ of the electrons along the film-thickness direction take discrete values as represented by formula (3) below.

$$E_n = n^2 \frac{\pi^2 \hbar^2}{8 \, mL^2}, \, (n = 1, 2, 3, \ldots) \quad (3)$$

In formula (3), m indicates the effective mass of an electron and L indicates the thickness of the channel layer 23.

In the descriptions below, an energy level $E_1$ when n=1 is referred to as a "ground level". Also, an energy level $E_k$ when n=k is referred to as a "kth excited level".

As long as electrons can be confined in the channel layer 23, the material of the channel layer 23 is not limited to GaN, and the channel layer 23 may be formed of InAlGaN.

Figure 7:
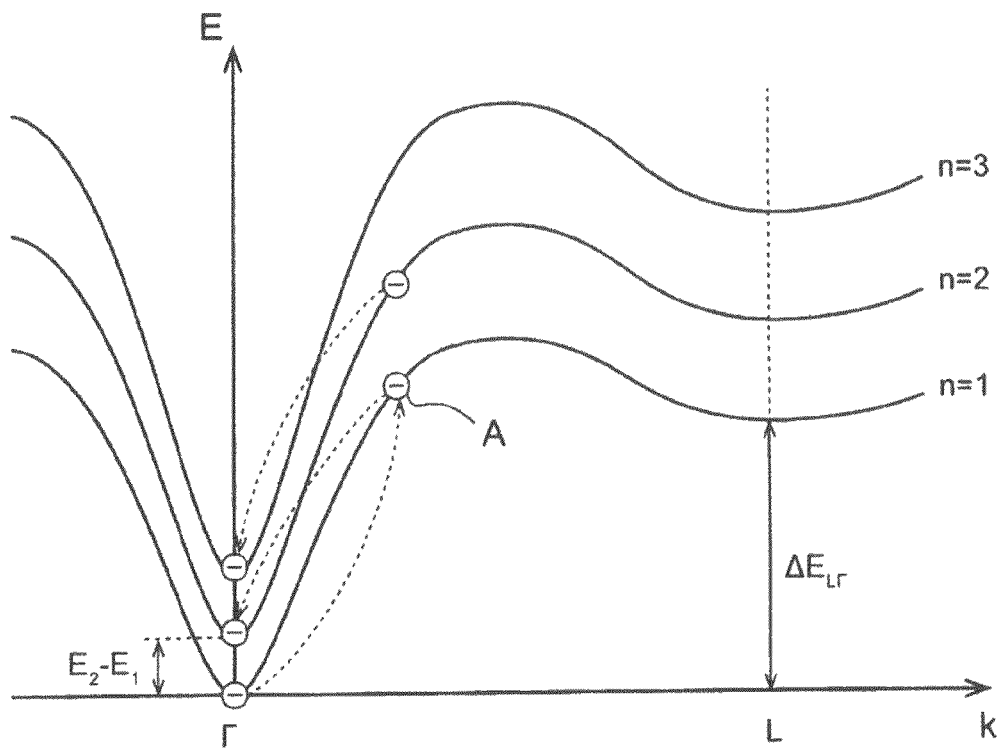
FIG. 7 is a graph illustrating an E–k dispersion relation of electrons in the channel layer of the compound semiconductor device according to the first embodiment.

FIG. 7 is a graph illustrating an E–k dispersion relation of electrons in the channel layer 23.

As illustrated in FIG. 7, as a result of the discretization of the energy levels $E_n$ of electrons, subbands corresponding to values of "n" are formed in the channel layer 23.

Here, when no drain voltage is applied between the source electrode 25 and the drain electrode 26, electrons are in a thermal equilibrium state, and many electrons exist near the point Γ where the energy level is lowest (ground level, n=1). When a drain voltage is applied, some electrons are accelerated and acquire high energy, release phonons, and transition to a state A where the electrons have a different energy level and a different wave number.

At this stage, in the first embodiment, a point Γ in a second excited level (n=2) at which energy is lower than energy in the state A may become ready to accept electrons. Also, the energy at the point Γ is lower than the energy at a point L in the ground level (n=1). Therefore, compared with a case where an electron transitions from the state A to the point L in the ground level (n=1), the change in the wave number of an electron in a case where the electron transitions from the state A to the point Γ in the second excited level (n=2) becomes smaller, and the probability that the electron transitions from the state A to the point Γ in the second excited level (n=2) increases.

This in turn reduces the probability that electrons transition to the point L, and makes it possible to prevent generation of heavy electrons with large effective mass.

Also, because electrons transitioned to the point Γ in the second excited level (n=2) have small effective mass, the electrons can be quickly started to move again at high speed by an electric field after the electron velocity is lost. Accordingly, the above configuration makes it possible to increase the mean velocity of the two dimensional electron gas "e".

Further, for the same reasons discussed above, the probability that electrons in the second excited level (n=2) transition to a point Γ in a third excited level (N–3) increases, and it is possible to prevent the effective mass of the electrons from increasing.

Next, a preferable energy difference between subbands is described.

When an energy difference $E_2-E_1$ between the second excited level and the ground level is smaller than optical phonon energy $E_{op}$ of the channel layer 23, electrons near the points Γ in respective levels can freely transition between the ground level and the second excited level by releasing and absorbing optical phonons. This in turn increases the optical phonon scattering rate and causes electrons to be quickly scattered even if the electrons are located near the points Γ. As a result, the velocity of the electrons is reduced and it becomes difficult to increase the electron velocity.

For the above reason, it is preferable to prevent the occurrence of optical phonon scattering near the points Γ by making the energy difference $E_2-E_1$ greater than the optical phonon energy $E_{op}$.

The optical phonon energy of the GaN layer used as the channel layer 23 is 88 MeV. Therefore, in the first embodiment, the energy difference $E_2-E_1$ is made greater than 88 MeV.

According to formula (3) above, the energy difference $E_2-E_1$ can be increased by reducing a thickness L of the channel layer 23. Therefore, it is preferable to make the energy difference $E_2-E_1$ greater than the optical phonon energy $E_{op}$ by reducing the thickness L as much as possible.

The energy difference $E_2-E_1$ may be adjusted by not only adjusting the thickness L but also appropriately setting the band offset ΔEc between the channel layer 23 and the buffer layer 22 and the band offset ΔEc between the channel layer 23 and the electron supply layer 24.

Also, because the energy $E_n$ is proportional to the square of "n" according to formula (3), an energy difference $E_3-E_2$ between the third excited level (n=3) and the second excited level (n=2) is greater than the energy difference $E_2-E_1$ between the second excited level (n=2) and the ground level (n=1). Similarly, an energy difference between higher levels is also greater than the energy difference $E_2-E_1$. Accordingly, when the energy difference $E_2-E_1$ is made greater than the optical phonon energy $E_{op}$, the occurrence of optical phonon scattering in a level higher than the second excited level can also be prevented.

However, if the energy difference $E_2-E_1$ is made excessively large, a problem as described below occurs.

As an example, consider a case where the energy difference $E_2-E_1$ is greater than an energy difference $\Delta E_{L\Gamma}$ between a point L and a point Γ in a subband corresponding to the ground level (n=1). In this case, an electron near the state A in the ground level (n=1) needs to balance the energy budget by, for example, absorbing multiple phonons at the same time in order to transition to a position near the point Γ in the second excited level (n=2). Therefore, the probability that the electron transitions to the point Γ in the second excited level (n=2) becomes extremely low.

Accordingly, the electron near the state A transitions to the point L in the ground level (n=1) instead of transitioning to the second excited level (n=2), and the velocity of the electron decreases.

To prevent such a problem, the energy difference $E_2-E_1$ is preferably made smaller than the energy difference $\Delta E_{L\Gamma}$ to increase the probability that an electron in the ground level (n=1) transitions to the second excited level (n=2). The energy difference $E_2-E_1$ can be made smaller than the energy difference $\Delta E_{L\Gamma}$ by, for example, adjusting the thickness of the channel layer 23 and/or adjusting the composition ratio x of Al in $Al_xGa_{1-x}N$ forming the buffer layer 22 and the composition ratio y of Al in $Al_yGa_{1-y}N$ forming the electron supply layer 24.

Figure 8:
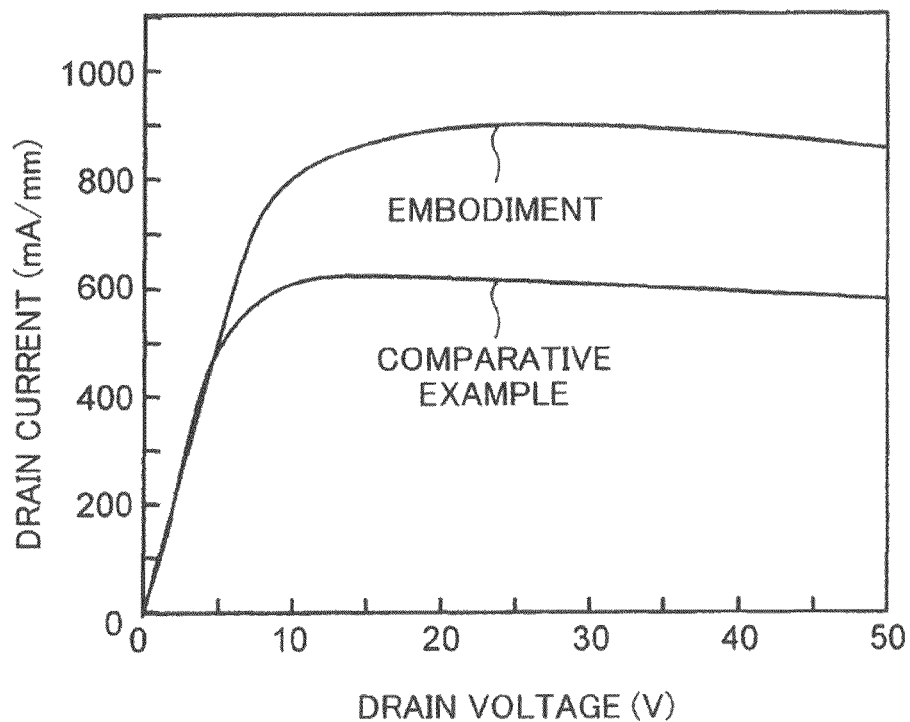
FIG. 8 is a graph illustrating a drain current of the compound semiconductor device according to the first embodiment.

To confirm that the electron velocity actually increases with the configuration of the first embodiment, the inventors of the present invention calculated the drain current in the compound semiconductor device 30. FIG. 8 illustrates results of the calculations.

A horizontal axis in FIG. 8 indicates a drain voltage applied between the source electrode 25 and the drain electrode 26. A vertical axis in FIG. 8 indicates a drain current flowing between the source electrode 25 and the drain electrode 26. In the calculations, the substrate temperature is set at 300 K, and the gate voltage is set at 0 V.

FIG. 8 also illustrates a drain current in the compound semiconductor device 1 of FIG. 1 as a comparative example.

As illustrated in FIG. 8, in the comparative example, the drain current starts to decrease when the drain voltage exceeds 10 V.

In contrast, in the first embodiment, the drain current continues to increase even after the drain voltage exceeds 10 V and becomes greater than the drain current obtained in the comparative example.

The above results confirm that forming a quantum well structure with the channel layer 23 as in the first embodiment makes it possible to increase the electron velocity and thereby increase the drain current, and makes it possible to increase the power of a HEMT.

In the first embodiment, as described above, the thickness of the channel layer 23 is reduced to make the energy difference $E_2-E_1$ greater than the optical phonon energy $E_{op}$.

Figure 9:
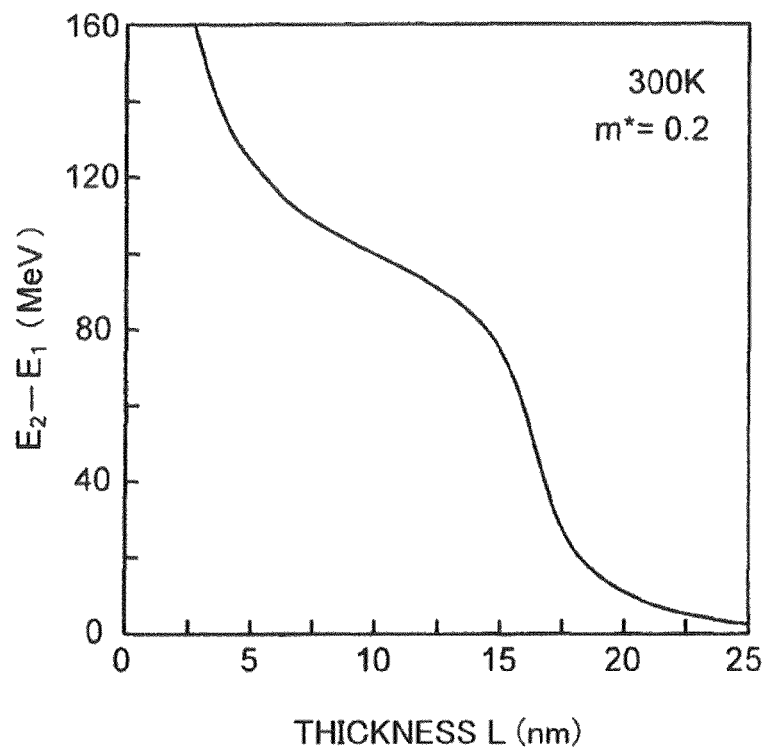
FIG. 9 is a graph illustrating a relationship between an energy difference $E_2-E_1$ and the thickness of the channel layer of the compound semiconductor device according to the first embodiment.

The inventors of the present invention calculated changes in the energy difference $E_2-E_1$ in relation to changes in the thickness L of the channel layer 23. FIG. 9 illustrates results of the calculations.

In the calculations, it is assumed that an AlN layer with a thickness of 500 nm is formed as the buffer layer 22, and an AlN layer with a thickness of 8 nm is formed as the electron supply layer 24. Also, both of the band offset ΔEc between the buffer layer 22 and the channel layer 23 and the band offset ΔEc between the channel layer 23 and the electron supply layer 24 are set at 2 eV. The effective mass m* of the electron is set at 0.2, and the temperature is set at 300 K. The lattice constant of AlN is used as the lattice constant of each layer, and the spontaneous polarization and the piezo polarization at the interfaces with respective layers are also considered in the calculations.

As illustrated in FIG. 9, as the thickness L decreases, the quantum confinement effect increases and the energy difference $E_2-E_1$ increases.

Particularly, when the thickness L becomes less than or equal to 5 nm, the quantum confinement effect becomes prominent and the energy difference $E_2-E_1$ greatly increases.

On the other hand, as the thickness L increases, the quantum confinement effect decreases and the energy difference $E_2-E_1$ decreases. Also, an inflection point appears at a position corresponding to the thickness L of about 15 nm due to an internal field of the channel layer 23 that is caused by the spontaneous polarization and the piezo polarization at the interfaces with respective layers, and the energy difference $E_2-E_1$ sharply decreases when the thickness L exceeds 15 nm. When the thickness L reaches 25 nm, the quantum confinement effect is almost lost.

The above results indicate that the thickness L is preferably less than or equal to 15 nm to achieve the quantum confinement effect in the channel layer 23 and to make the energy difference $E_2-E_1$ sufficiently large.

On the other hand, if the thickness L is excessively reduced, a problem as described below occurs.

Figure 10:
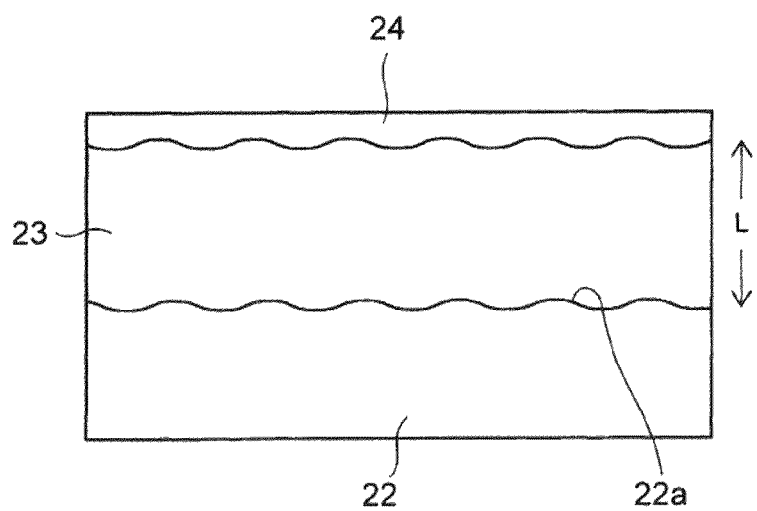
FIG. 10 is an enlarged cross-sectional view of an area around the channel layer of the compound semiconductor device according to the first embodiment.

FIG. 10 is an enlarged cross-sectional view of an area around the channel layer 23.

As illustrated in FIG. 10, when the thickness L of the channel layer 23 is reduced, electrons moving in the channel layer 23 become more likely to be scattered by the "uneven" surface 22a of the buffer layer 22 below the channel layer 23.

For this reason, when surface roughness Ra of the surface 22a is large, the electron velocity does not improve even if electrons can be held near the point Γ.

Figure 11:
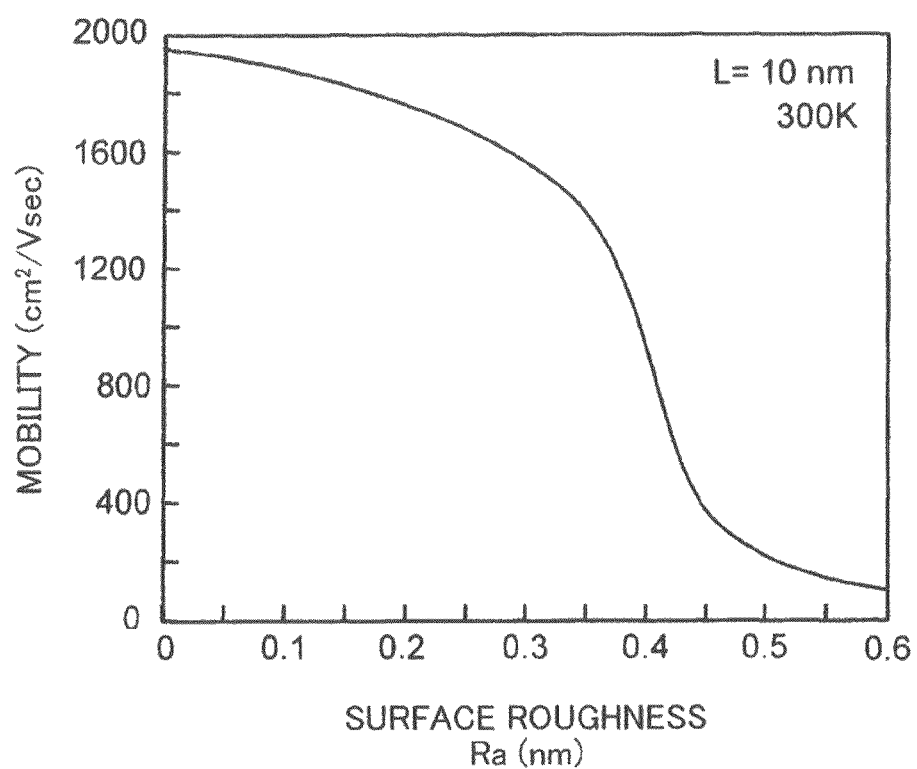
FIG. 11 is a graph illustrating a relationship between the surface roughness of a buffer layer and the electron mobility of two dimensional electron gas in the channel layer of the compound semiconductor device according to the first embodiment.

The inventors of the present invention studied the relationship between the surface roughness Ra of the surface 22a of the buffer layer 22 and the electron mobility of the two dimensional electron gas in the channel layer 23. FIG. 11 illustrates results of the study.

In the study, arithmetic average roughness was used as the surface roughness Ra.

As illustrated in FIG. 11, the electron mobility decreases as the surface roughness Ra increases. Particularly, the electron mobility sharply decreases when the surface roughness Ra becomes 0.4 nm. Accordingly, to maintain high electron mobility in the channel layer 23, the surface roughness Ra of the buffer layer 22 is preferably made less than or equal to 0.4 nm.

The surface roughness Ra can be adjusted by controlling the substrate temperature during a process of forming the buffer layer 22. For example, the surface roughness Ra can be made less than or equal to 0.4 nm by making the substrate temperature greater than or equal to 1400° C.

The first embodiment is described above. However, the present invention is not limited to the first embodiment. For example, although nitride semiconductors are used as materials of the buffer layer 22, the channel layer 23, and the electron supply layer 24 in the first embodiment, GaAs compound semiconductors may instead be used for those layers. This also applies to other embodiments described below.

<Second Embodiment>

In a second embodiment, the contact resistance of the source electrode 25 and the drain electrode 26 is reduced with a configuration described below.

FIGS. 12A through 15 are drawings illustrating a process of manufacturing a compound semiconductor device according to the second embodiment.

The same reference numbers as those assigned to components described in the first embodiment are assigned to the corresponding components in FIGS. 12A through 15, and descriptions of those components are omitted here.

Figure 12A:
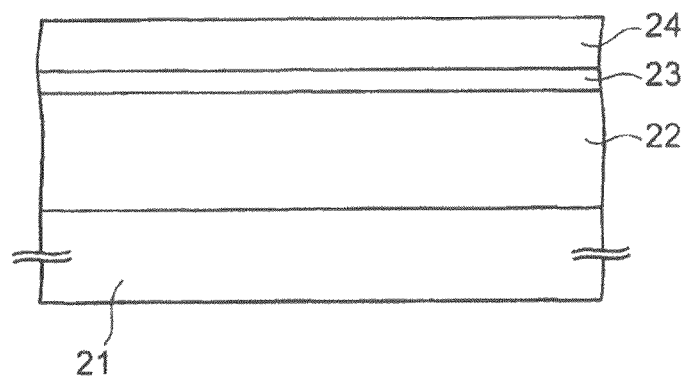
FIGS. 12A and 12B are drawings illustrating a part of a process of manufacturing a compound semiconductor device according to a second embodiment.

First, the process illustrated by FIGS. 3A through 4A of the first embodiment is performed to produce a structure illustrated in FIG. 12A that includes an electron supply layer 24 as the uppermost layer.

Figure 12B:
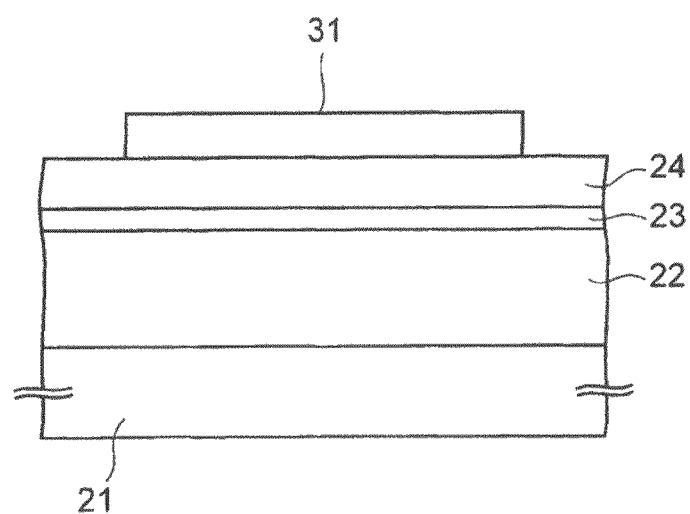

Next, as illustrated in FIG. 12B, a silicon oxide film is formed as a hard mask 31 on the electron supply layer 24 by chemical vapor deposition (CVD). Then, the hard mask 31 is patterned to remove portions of the hard mask 31 from areas where the source electrode 25 and the drain electrode 26 are to be formed.

Figure 13A:
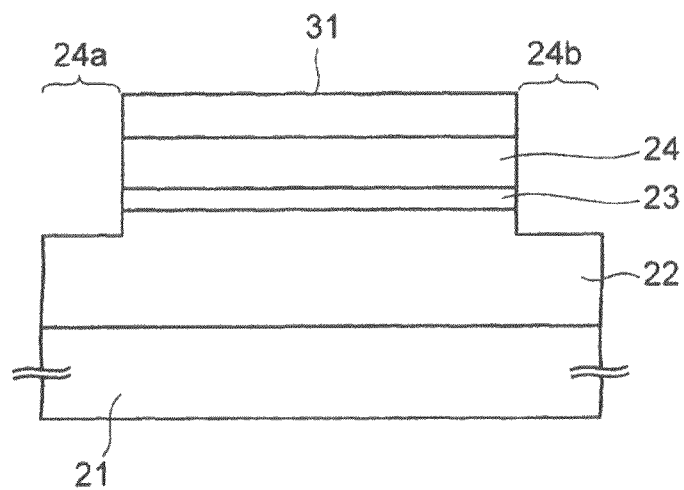
FIGS. 13A and 13B are drawings illustrating a part of the process of manufacturing the compound semiconductor device according to the second embodiment.

Next, as illustrated in FIG. 13A, portions of the buffer layer 22, the channel layer 23, and the electron supply layer 24 not covered by the hard mask 31 are removed by dry etching to form a first recess 24a and a second recess 24b that reach the buffer layer 22.

Figure 13B:
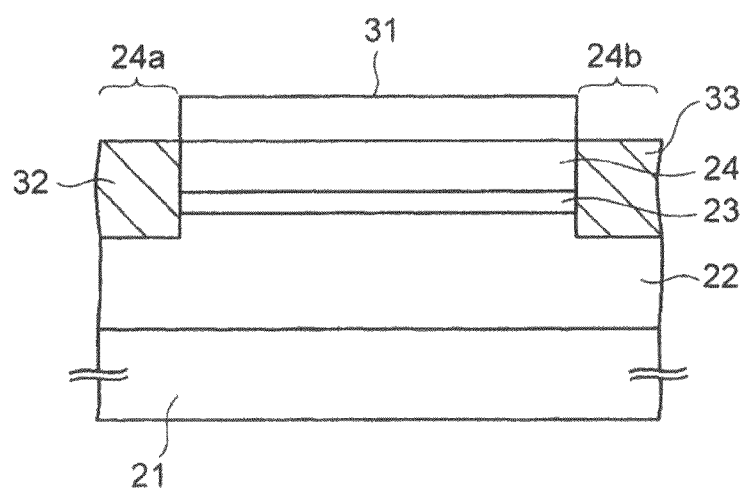

Next, as illustrated in FIG. 13B, n-type GaN layers are grown, by MOCVD, as a first contact layer 32 and a second contact layer 33 in the first and second recesses 24a and 24B.

In this example, a mixed gas of a TMG gas and an ammonia gas is used as a growth gas for the first and second contact layers 32 and 33, and a silane ($SiH_4$) gas is added to the growth gas to dope the first and second contact layers 32 and 33 with silicon that is a donor impurity. The concentration of silicon in the first and second contact layers 32 and 33 is high at about $2 \times 10^{19}$ $cm^{-3}$.

Instead of silicon, germanium may also be used as a donor impurity.

Figure 14A:
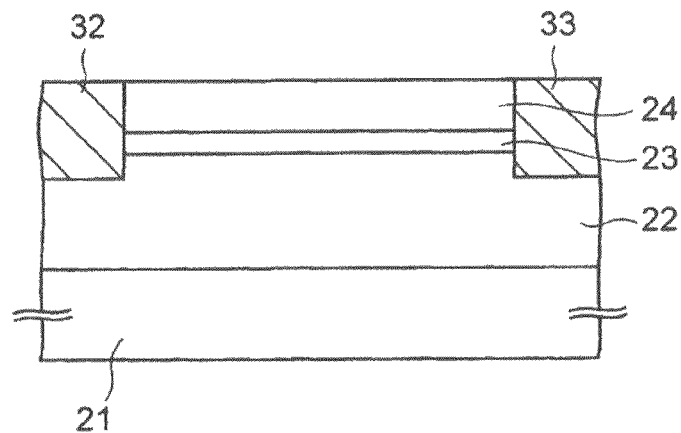
FIGS. 14A and 14B are drawings illustrating a part of the process of manufacturing the compound semiconductor device according to the second embodiment.

Next, as illustrated in FIG. 14A, the remaining hard mask 31 is removed by wet etching.

Figure 14B:
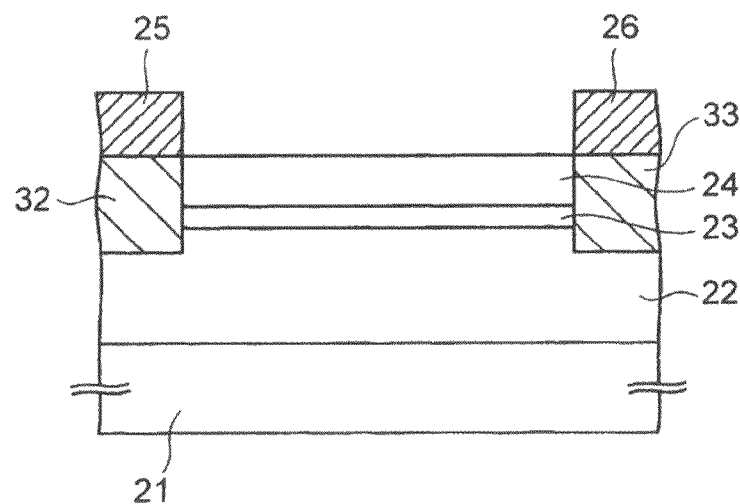

Next, as illustrated in FIG. 14B, a metal multilayer film is formed by vapor deposition over the electron supply layer 24 and the first and second contact layers 32 and 33, and the metal multilayer film is patterned by a lift-off technique to form the source electrode 25 and the drain electrode 26 on the first and second contact layers 32 and 33. The metal multilayer film is constituted by, for example, a titanium layer and an aluminum layer that are formed in this order.

Then, the source electrode 25 and the drain electrode 26 are heated in a nitrogen atmosphere at a substrate temperature between about 400° C. and about 1000° C. As a result, the material of the source electrode 25 diffuses into the first contact layer 32, and an ohmic contact is formed between the source electrode 25 and the first contact layer 32. Similarly, an ohmic contact is formed between the drain electrode 26 and the second contact layer 33.

Figure 15:
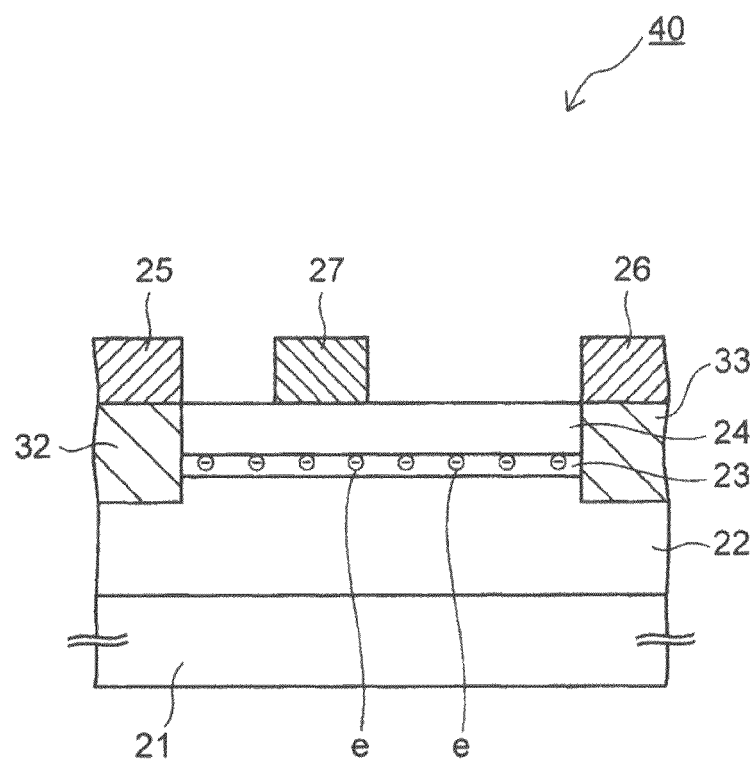
FIG. 15 is a drawing illustrating a part of the process of manufacturing the compound semiconductor device according to the second embodiment.

Next, as illustrated in FIG. 15, a nickel layer and a gold layer are formed in this order by vapor deposition over the electron supply layer 24, the source electrode 25, and the drain electrode 26, and the resulting multilayer film is patterned by a lift-off technique to form a gate electrode 27 on the electron supply layer 24 between the source electrode 25 and the drain electrode 26.

Through the above process, the basic structure of a compound semiconductor device 40 of the second embodiment is formed.

In the compound semiconductor device 40 of the second embodiment, the source electrode 25 and the drain electrode 26 are formed on the first and second contact layers 32 and 33 that are doped with a high concentration of donor impurity. This configuration makes it possible to reduce the contact resistance between the first contact layer 32 and the source electrode 25 and the contact resistance between the second contact layer 33 and the drain electrode 26.

<Third Embodiment>

In the first and second embodiments, a Schottky gate structure, where the gate electrode 27 is formed directly on the electron supply layer 24, is employed.

In a third embodiment, a gate insulation film is formed to reduce a gate leakage current.

Figure 16A:
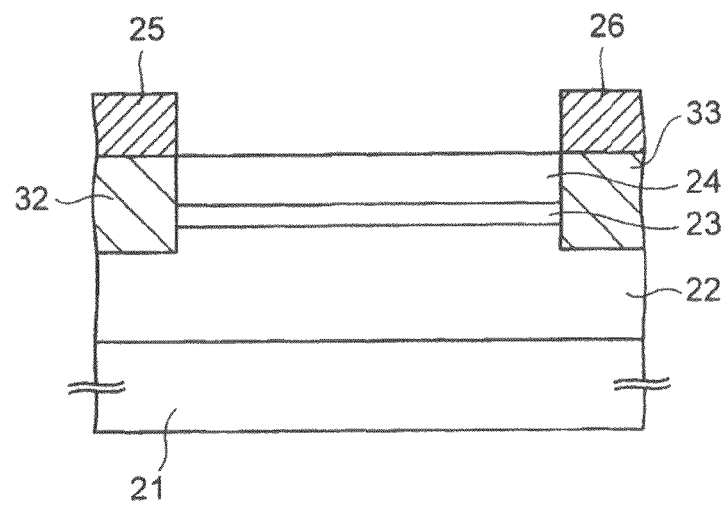
FIGS. 16A and 16B are drawings illustrating a part of a process of manufacturing a compound semiconductor device according to a third embodiment.
Figure 16B:
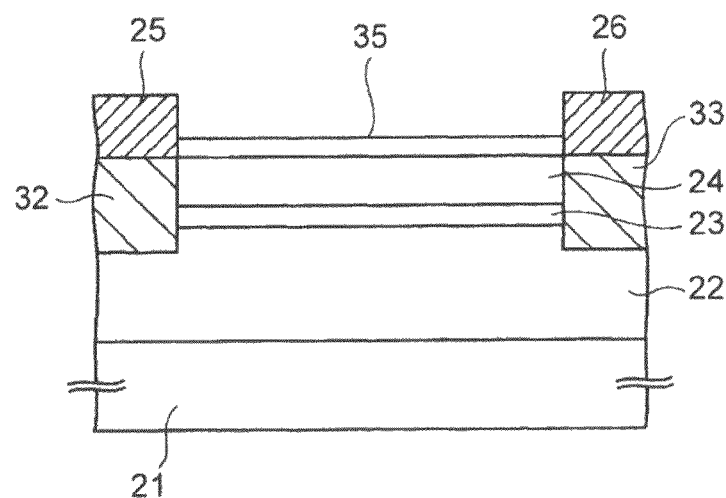
Figure 17:
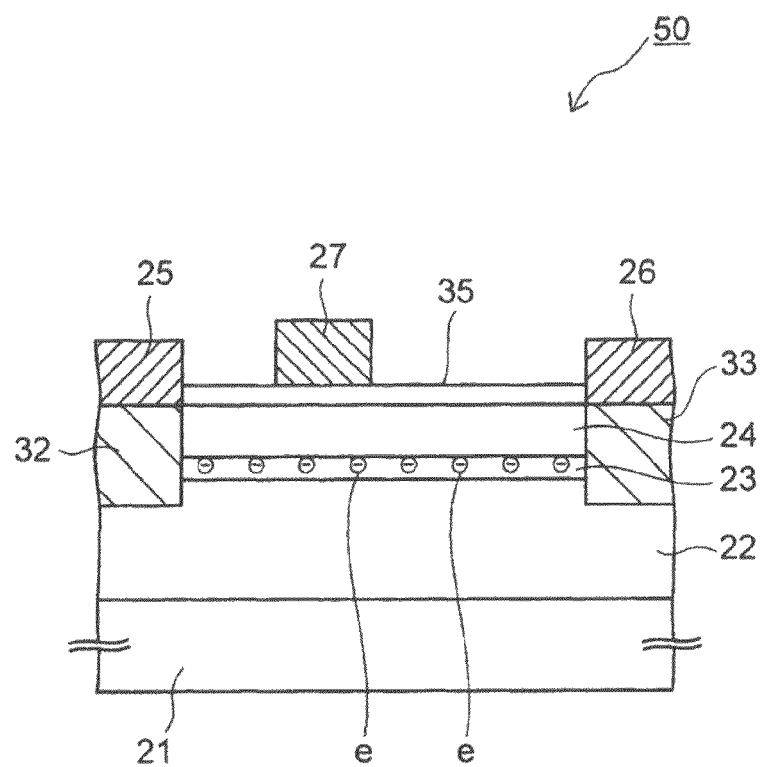
FIG. 17 is a drawing illustrating a part of the process of manufacturing the compound semiconductor device according to the third embodiment.

FIGS. 16A through 17 are drawings illustrating a process of manufacturing a compound semiconductor device according to the third embodiment.

The same reference numbers as those assigned to components described in the first and second embodiments are assigned to the corresponding components in FIGS. 16A through 17, and descriptions of those components are omitted here.

First, the process illustrated by FIGS. 12A through 14B of the second embodiment is performed to produce a structure illustrated in FIG. 16A where a source electrode 25 and a drain electrode 26 are formed on first and second contact layers 32 and 33.

Next, as illustrated in FIG. 16B, an alumina ($Al_2O_3$) film with a thickness between about 2 nm and about 20 nm is formed by CVD as a gate insulation film 35 on the electron supply layer 24, the source electrode 25, and the drain electrode 26. Instead of CVD, the gate insulation film 35 may be formed by atomic layer deposition (ALD).

Also, instead of the alumina film, the gate insulation film 35 may be implemented by an aluminum oxynitride (AlON) film, a silicon dioxide ($SiO_2$) film, or a silicon oxynitride (SiON) film.

Next, the gate insulation film 35 is patterned such that the gate insulation film 35 remains only on the electron supply layer 24 between the source electrode 25 and the drain electrode 26.

Next, as illustrated in FIG. 17, a nickel layer and a gold layer are formed in this order by vapor deposition over the gate insulation film 35, the source electrode 25, and the drain electrode 26, and the resulting multilayer film is patterned by a lift-off technique to form a gate electrode 27 on the gate insulation film 35.

Through the above process, the basic structure of a compound semiconductor device 50 of the third embodiment is formed.

In the compound semiconductor device 50 of the third embodiment, the gate insulation film 35 is formed between the electron supply layer 24 and the gate electrode 27. This configuration makes it possible to block a gate leakage current that flows between the electron supply layer 24 and the gate electrode 27 by the gate insulation film 35.

<Fourth Embodiment>

In a fourth embodiment, a decrease in the density of two dimensional electron gas is prevented with a configuration described below.

Figure 18A:
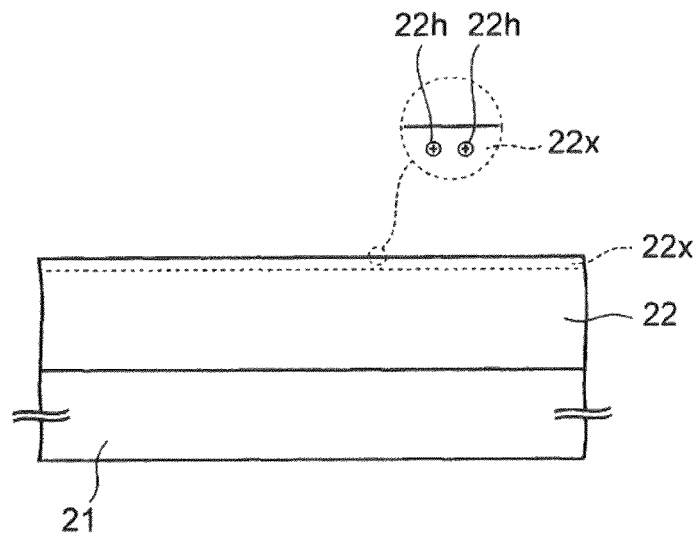
FIGS. 18A and 18B are drawings illustrating a process of manufacturing a compound semiconductor device according to a fourth embodiment.
Figure 18B:
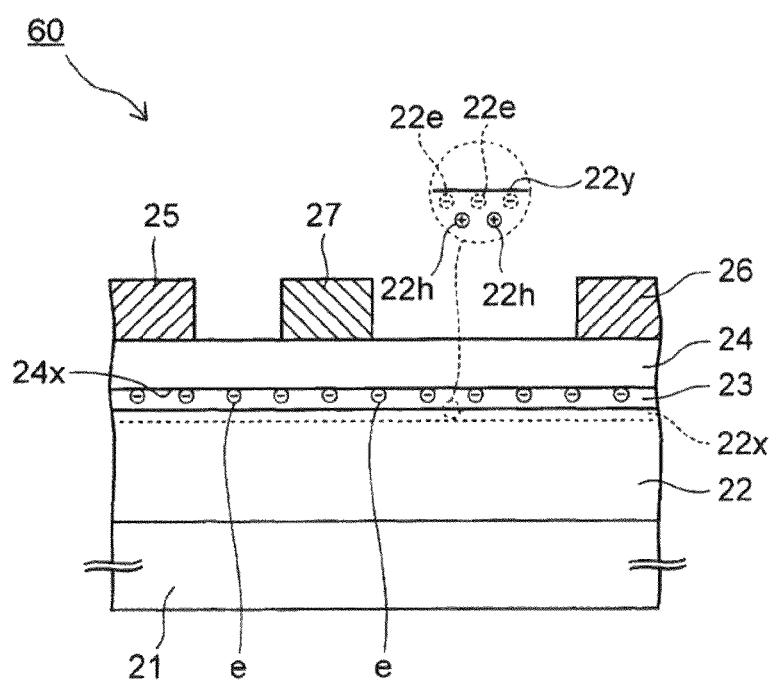

FIGS. 18A and 18B are drawings illustrating a process of manufacturing a compound semiconductor device according to the fourth embodiment. The same reference numbers as those assigned to components described in the first through third embodiments are assigned to the corresponding components in FIGS. 18A and 18B, and descriptions of those components are omitted here.

First, as illustrated in FIG. 18A, an $Al_xGa_{1-x}N$ ($0<x\leq 1$) layer with a thickness of about 500 nm is formed as a buffer layer 22 over a substrate 21 by performing MOCVD as in the process illustrated in FIG. 3A of the first embodiment.

As described in the first embodiment, a mixed gas of the TMG gas, the TMA gas, and the ammonia gas is used as a film-forming gas in MOCVD to form the buffer layer 22.

In the fourth embodiment, however, a silane gas is added to the film-forming gas in the final phase of the deposition process to dope a surface layer $22x$ of the buffer layer 22 with silicon that is used as a donor impurity $22h$.

The thickness of the surface layer $22x$ doped with the donor impurity $22h$ is between about 2 nm and about 5 nm. The concentration of the donor impurity $22h$ in the surface layer $22x$ is between about $1\times10^{18}$ cm$^{-3}$ and about $2\times10^{19}$ cm$^{-3}$.

After forming the buffer layer 22, the process illustrated by FIGS. 3B through 5 of the first embodiment is performed to form the basic structure of a compound semiconductor device 60 of the fourth embodiment illustrated in FIG. 18B.

As described above, in the fourth embodiment, the surface layer $22x$ of the buffer layer 22 is doped with silicon that is used as the donor impurity $22h$.

As illustrated in a dotted-line circle in FIG. 18B, the donor impurity $22h$ cancels negative fixed charge $22e$ that is generated at an interface $22y$ between the buffer layer 22 and the channel layer 23 due to a difference in spontaneous polarization between the buffer layer 22 and the channel layer 23.

Accordingly, the configuration of the fourth embodiment makes it possible to prevent the negative fixed charge $22e$ from suppressing the generation of the two dimensional electron gas "e" and prevent a decrease in the density of the two dimensional electron gas "e".

Figure 19:
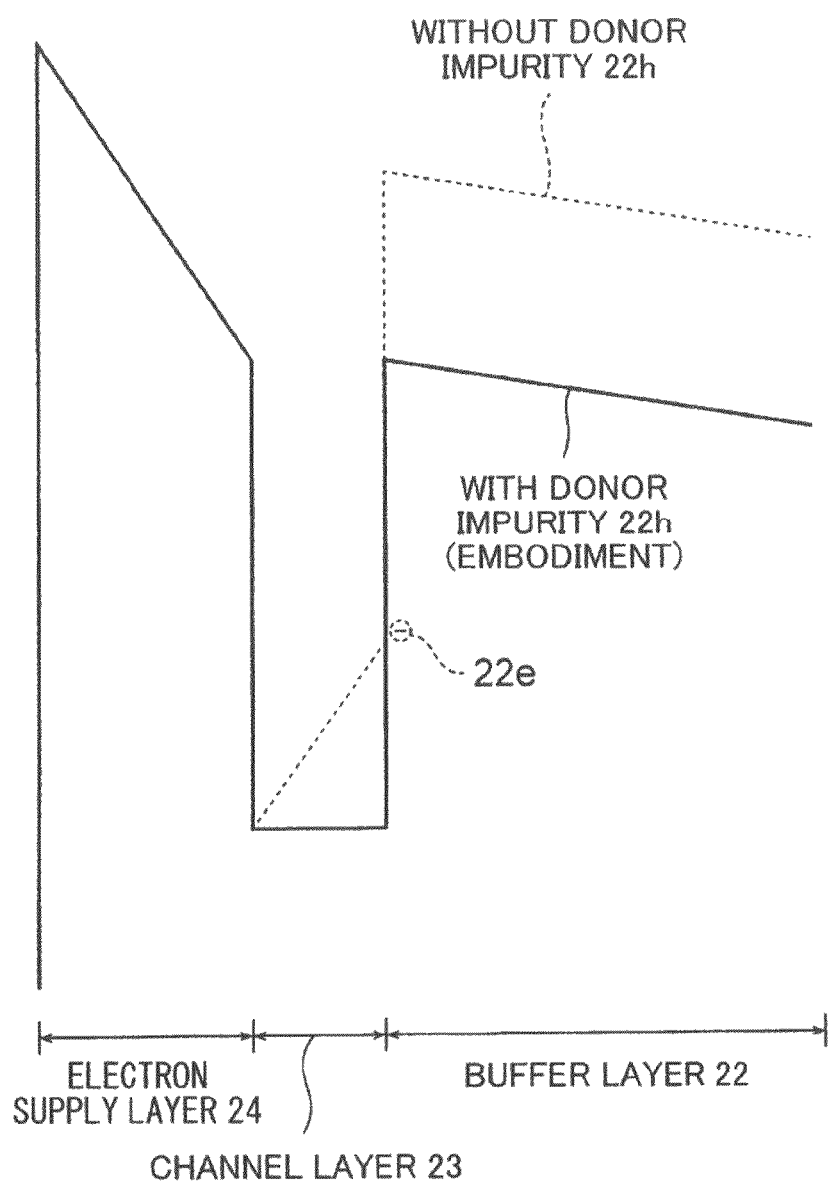
FIG. 19 is a graph illustrating a band structure of the compound semiconductor device according to the fourth embodiment.

FIG. 19 is a drawing illustrating a band structure of the compound semiconductor device 60.

In FIG. 19, a solid line indicates the band structure of the fourth embodiment, and a dotted line indicates the band structure of a comparative example where the surface layer $22x$ is not doped with the donor impurity $22h$.

In the comparative example, the band in the channel layer 23 is inclined due to the negative fixed charge 22e, and an internal field is generated in the channel layer 23.

The internal field causes the two dimensional electron gas "e" in the channel layer 23 to be pressed strongly against a lower surface 24x (see FIG. 18B) of the electron supply layer 24, and the velocity of the two dimensional electron gas "e" is reduced due to interface roughness scattering resulting from the roughness of the lower surface 24x.

In contrast, in the fourth embodiment, the band in the channel layer 23 is substantially flat because the negative fixed charge 22e is canceled by the donor impurity 22h, and an internal field is less likely to be generated in the channel layer 23. In other words, the configuration of the fourth embodiment makes it possible to prevent the two dimensional electron gas "e" from being pressed against the lower surface 24x, and prevent the velocity of the two dimensional electron gas "e" from being reduced due to interface roughness scattering resulting from the roughness of the lower surface 24x.

<Fifth Embodiment>

In a fifth embodiment, the interface roughness scattering of two dimensional electron gas is suppressed with a structure different from the structure of the fourth embodiment.

FIGS. 20A through 21B are drawings illustrating a process of manufacturing a compound semiconductor device according to the fifth embodiment. The same reference numbers as those assigned to components described in the first through fourth embodiments are assigned to the corresponding components in FIGS. 20A through 21B, and descriptions of those components are omitted here.

Figure 20A:
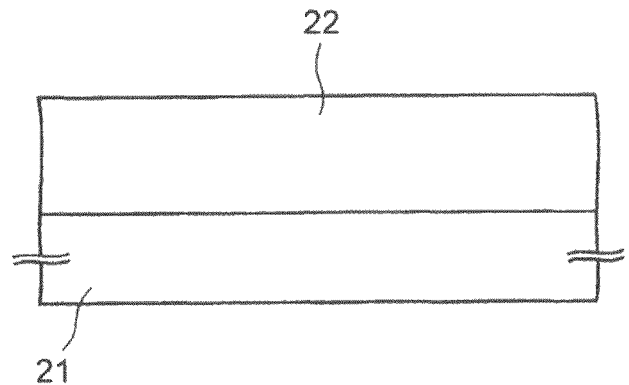
FIGS. 20A and 20B are drawings illustrating a part of a process of manufacturing a compound semiconductor device according to a fifth embodiment.

First, as illustrated in FIG. 20A, an AlN layer with a thickness of about 500 nm is formed as a buffer layer 22 over a substrate 21 through the process illustrated in FIG. 3A of the first embodiment.

Figure 20B:
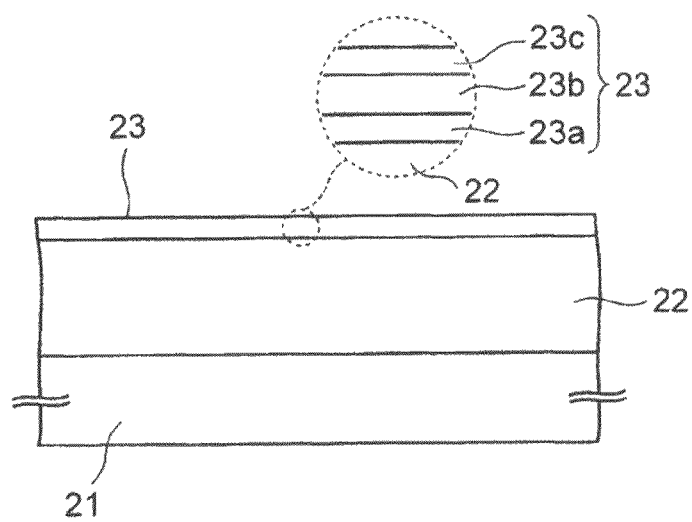

Next, as illustrated in FIG. 20B, an AlGaN layer with a thickness between about 1 nm and about 4 nm is formed by MOCVD on the buffer layer 22 as a lower layer 23a of a channel layer 23.

Next, a GaN layer with a thickness between about 2 nm and about 5 nm is formed by MOCVD as a middle layer 23b on the lower layer 23a. Then, an AlGaN layer with a thickness between about 2 nm and about 5 nm is formed by MOCVD as an upper layer 23c on the middle layer 23b. As a result, the channel layer 23 including the lower layer 23a, the middle layer 23b, and the upper layer 23c is formed.

The lower layer 23a, the middle layer 23b, and the upper layer 23c are formed in the same chamber by changing types of film-forming gas supplied into the chamber.

Any appropriate film-forming gas may be used for each layer. For example, a mixed gas of a TMA gas, a TMG gas, and an ammonia gas may be used to form the lower layer 23a and the upper layer 23c comprised of AlGaN. Also, a mixed gas of the TMG gas and the ammonia gas may be used to form the middle layer 23b comprised of GaN.

Figure 21A:
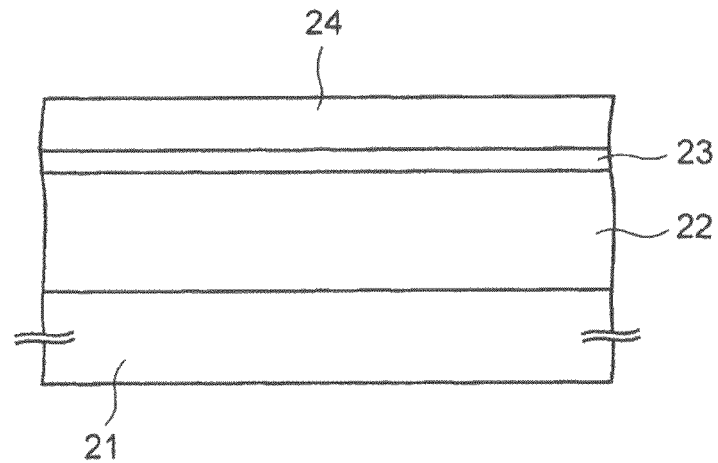
FIGS. 21A and 21B are drawings illustrating a part of the process of manufacturing the compound semiconductor device according to the fifth embodiment.

Next, as illustrated in FIG. 21A, an AlN layer with a thickness of about 10 nm is formed by MOCVD as an electron supply layer 24 over the channel layer 23.

Figure 21B:
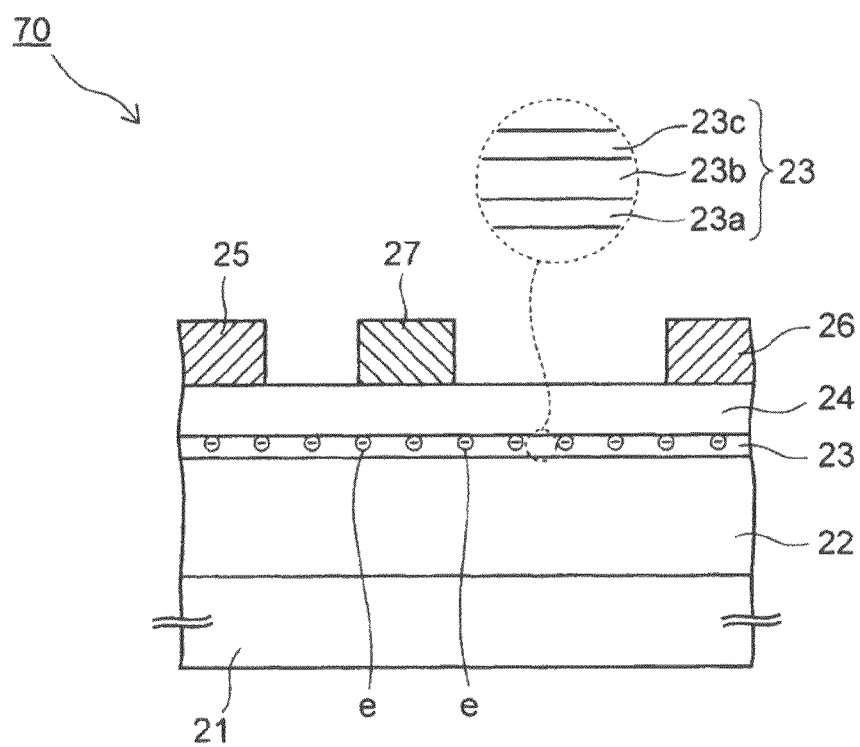

After forming the electron supply layer 24, the process illustrated by FIGS. 4B and 5 of the first embodiment is performed to form the basic structure of a compound semiconductor device 70 of the fifth embodiment illustrated in FIG. 21B.

Figure 22:
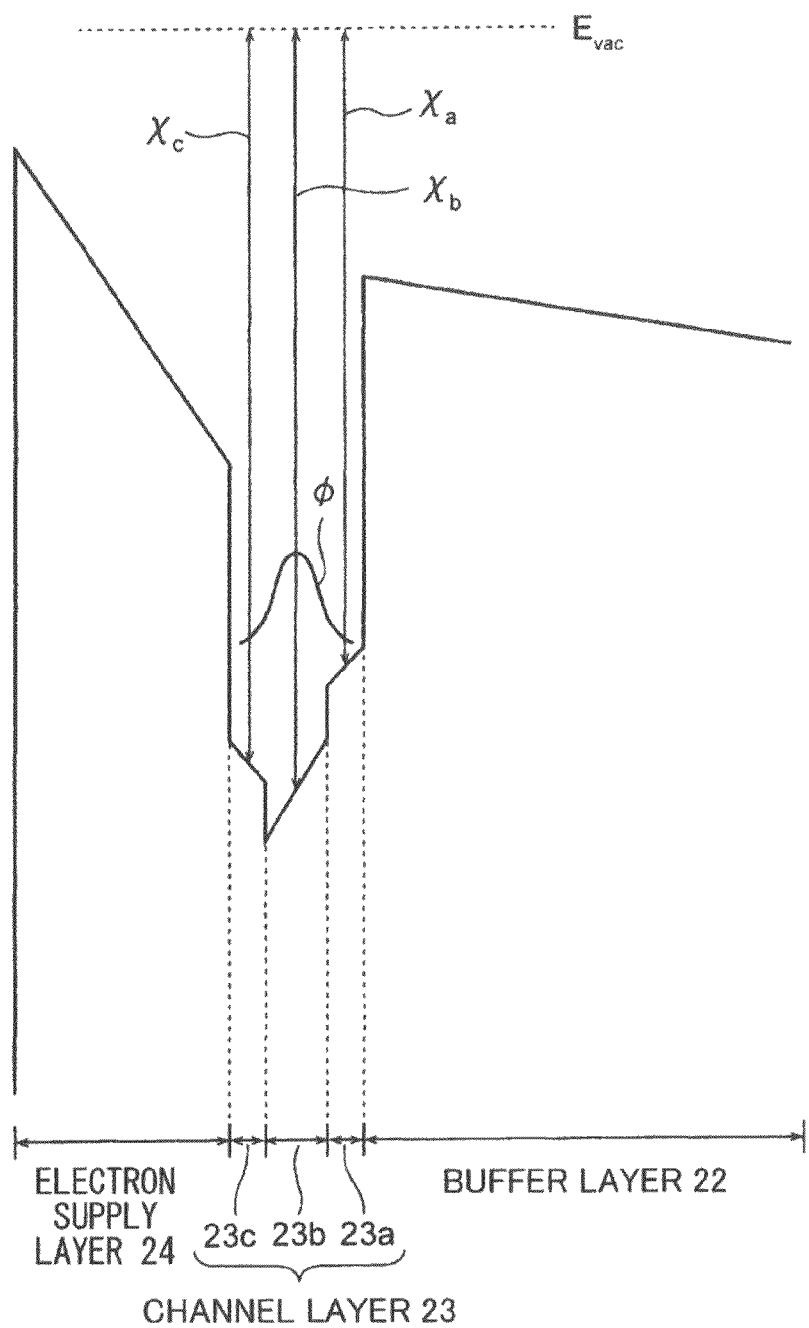
FIG. 22 is a graph illustrating a band structure of the compound semiconductor device according to the fifth embodiment.

FIG. 22 is a drawing illustrating a band structure of the compound semiconductor device 70.

In FIG. 22, $X_a$, $X_b$, and $X_c$ indicate, respectively, electron affinities of the lower layer 23a, the middle layer 23b, and the upper layer 23c. An electron affinity is defined as an energy difference between the vacuum level Evac and the conduction band.

The band gap of AlGaN forming the lower layer 23a and the upper layer 23c of the channel layer 23 is between the band gap (6.2 eV) of AlN forming the buffer layer 22 and the electron supply layer 24 and the band gap (3.4 eV) of GaN forming the middle layer 23.

For this reason, the electron affinity $X_a$ of the lower layer 23a and the electron affinity $X_c$ of the upper layer 23c become smaller than the electron affinity $X_b$ of the middle layer 23b, and the band of the channel layer 23 forms a staircase shape whose deepest part corresponds to the middle layer 23b.

Due to this band shape, the value of the electron wave function φ becomes highest (peak value) in the middle layer 23b and becomes low in the lower layer 23a and the upper layer 23c. For this reason, the electron existing probability in the lower layer 23a and the upper layer 23c decreases, and the interface roughness scattering at an interface between the buffer layer 22 and the lower layer 23a and the interface roughness scattering at an interface between the electron supply layer 24 and the upper layer 23c are suppressed.

This in turn makes it possible to prevent a decrease in the electron velocity of the two dimensional electron gas "e" due to interface roughness, and thereby makes it possible to maintain a high drain current.

When a square well potential is formed as in FIG. 6, the energy difference $E_{n+1}-E_n$ increases as the value of "n" increases as indicated by formula (3) described above. However, when the electron affinities $X_a$ and $X_c$ of the lower layer 23a and the upper layer 23c are lowered as in the fifth embodiment, the intervals between energy levels $E_n$ become substantially equal. Accordingly, even when the value of "n" is large, the energy at a point Γ in an energy level $E_{n+1}$ tends to become smaller than the energy at a point L in a subband corresponding to an energy level $E_n$, and the probability that an electron in the energy level $E_n$ transitions to the point Γ in the higher energy level $E_{n+1}$ increases. As described in the first embodiment, this in turn makes it possible to reduce the effective mass of electrons and increase the drain current.

Materials of the lower layer 23a, the middle layer 23b, and the upper layer 23c are not limited to those described above, and any appropriate materials may be used for these layers as long as their electron affinities satisfy the relationships $X_a<X_b$ and $X_c<X_b$. For example, the middle layer 23b may be formed of InGaN, the lower layer 23a may be formed of GaN, and the upper layer 23c may be formed of AlGaN.

<Sixth Embodiment>

In a sixth embodiment, a channel layer that is less likely to be damaged by high-energy electrons is described.

Figure 23A:
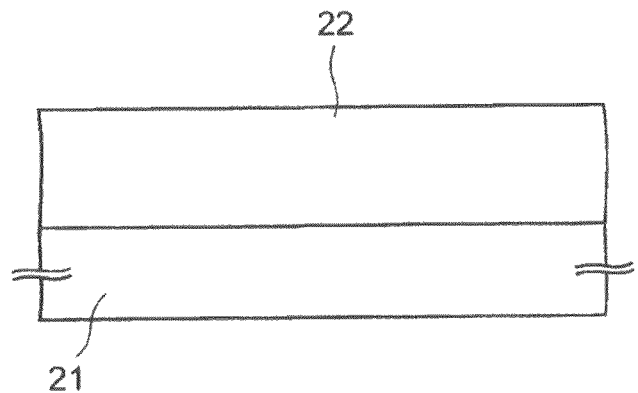
FIGS. 23A and 23B are drawings illustrating a part of a process of manufacturing a compound semiconductor device according to a sixth embodiment.
Figure 23B:
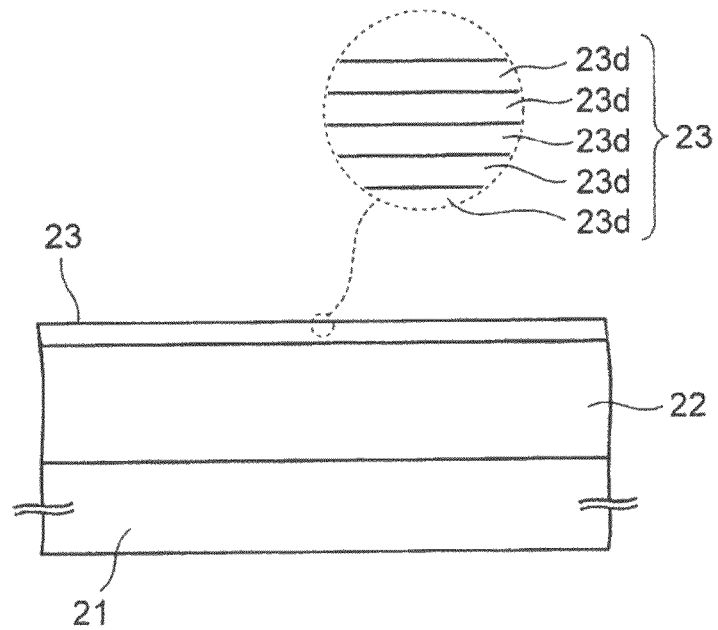
Figure 24:
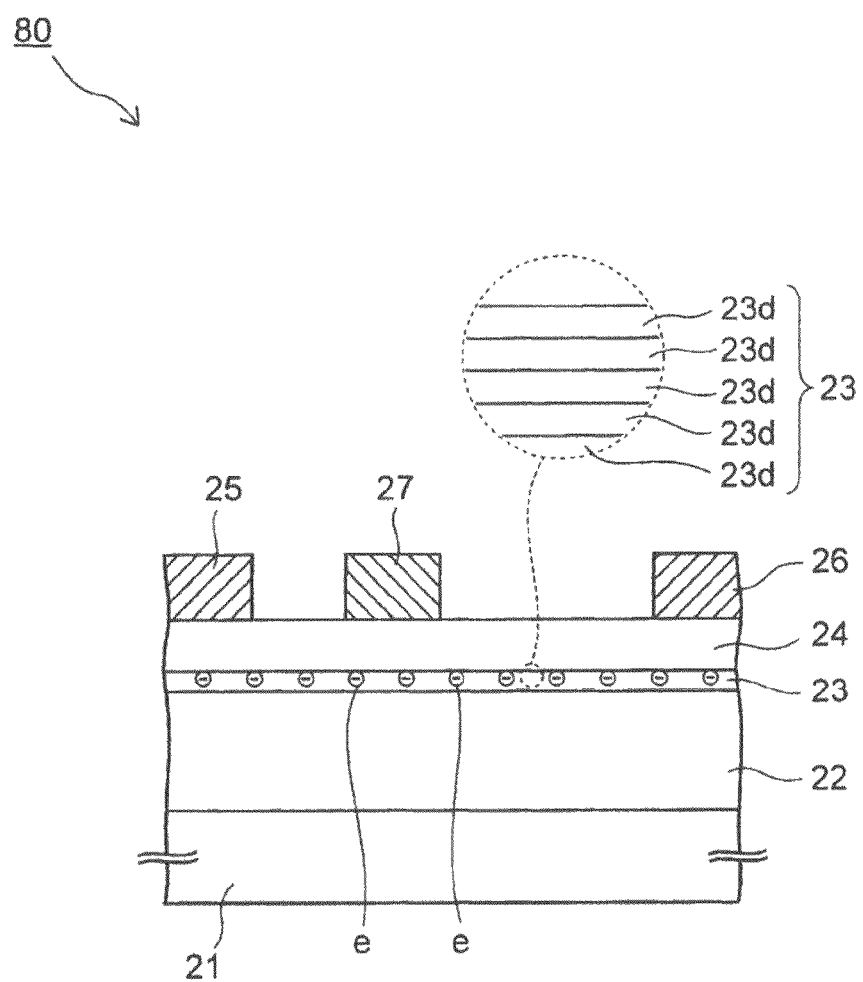
FIG. 24 is a drawing illustrating a part of the process of manufacturing the compound semiconductor device according to the sixth embodiment.

FIGS. 23A through 24 are drawings illustrating a process of manufacturing a compound semiconductor device according to the sixth embodiment. The same reference numbers as those assigned to components described in the first through fifth embodiments are assigned to the corresponding components in FIGS. 23A through 24, and descriptions of those components are omitted here.

First, as illustrated in FIG. 23A, an $Al_xGa_{1-x}N$ (0<x≤1) layer with a thickness of about 500 nm is formed as a buffer layer 22 over a substrate 21 by performing the process illustrated in FIG. 3A of the first embodiment.

Next, as illustrated in FIG. 23B, multiple well layers 23d each having a thickness between about 1 nm and about 3 nm are formed by MOCVD as a channel layer 23 on the buffer layer 22. The number of the well layers 23d is about two to five.

Each of the well layers 23d may have any appropriate composition. In this example, a GaN layer is formed as the uppermost well layer 23d, and AlGaN layers are formed as well layers 23d below the uppermost well layer 23d.

The AlGaN layers have different composition ratios of Al and are arranged in ascending order of the composition ratios of Al in a direction toward the substrate 21.

A mixed gas of a TMG gas, a TMA gas, and an ammonia gas is used to form each of the AlGaN layers, and the composition ratio of Al in an AlGaN layer closer to the substrate 21 is increased by increasing the flow rate of the TMA gas in the mixed gas.

A mixed gas of a TMG gas and an ammonia gas is used to form the GaN layer for the uppermost well layer 23d.

After forming the channel layer 23, the process illustrated by FIGS. 4A through 5 of the first embodiment is performed to form the basic structure of a compound semiconductor device 80 of the sixth embodiment illustrated in FIG. 24.

Figure 25:
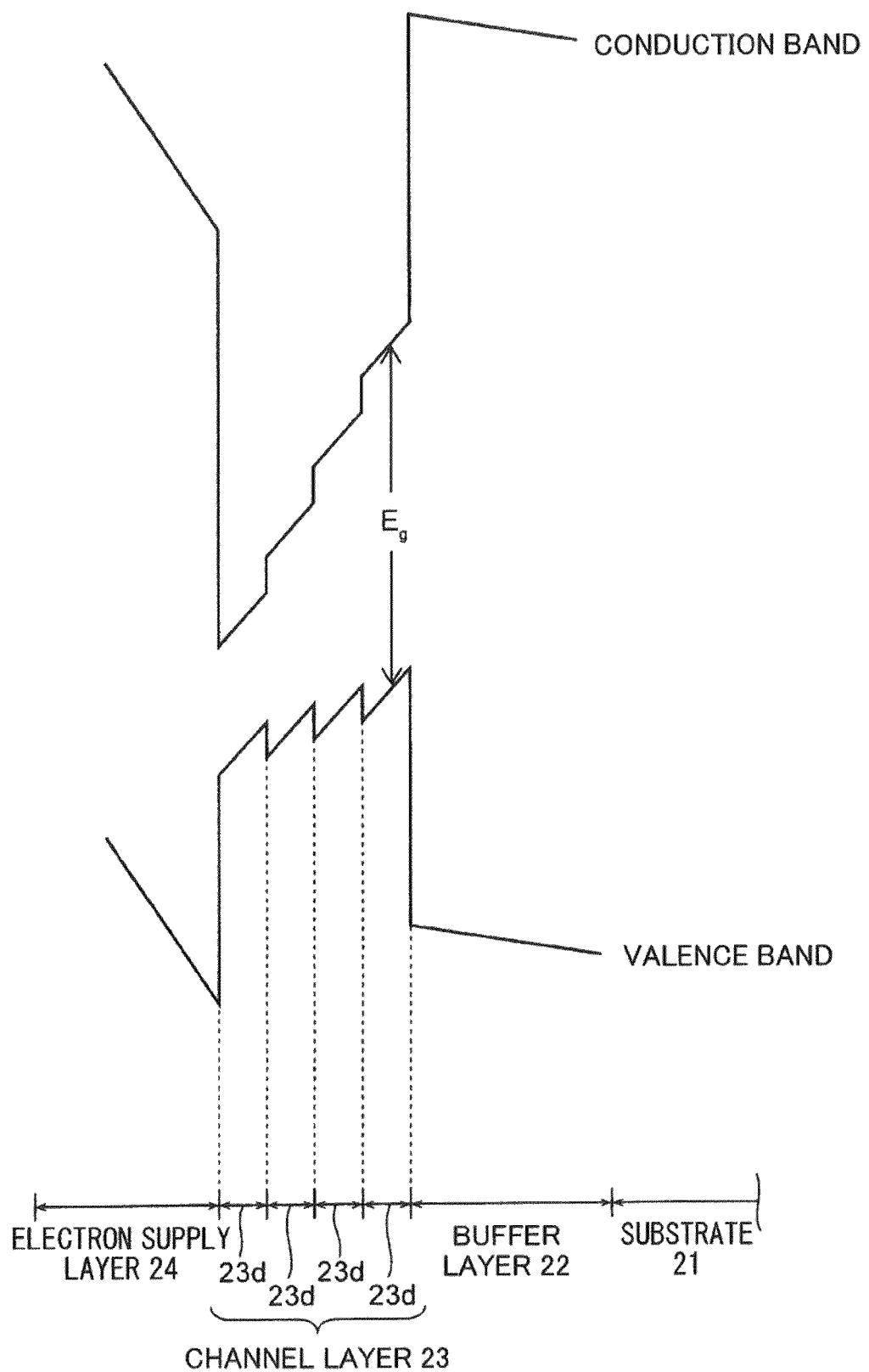
FIG. 25 is a graph illustrating a band structure of the compound semiconductor device according to the sixth embodiment.

FIG. 25 is a drawing illustrating a band structure of the compound semiconductor device 80.

In the sixth embodiment, as described above, the well layers 23d include at least one upper well layer 23d and two or more lower well layers 23d that are closer to the substrate 21 than the upper well layer 23d. The lower well layers 23d are AlGaN layers that have different composition ratios of Al and are arranged in ascending order of the composition ratios of Al in a direction toward the substrate 21.

Because the band gap of AlGaN becomes wider as the Al composition ratio increases, as illustrated in FIG. 25, a band gap Eg of the well layer 23d becomes wider as the position of the well layer 23d becomes closer to the substrate 21. In other words, the well layers 23d are arranged in ascending order of the widths of the band gaps in a direction toward the substrate 21.

Figure 26:
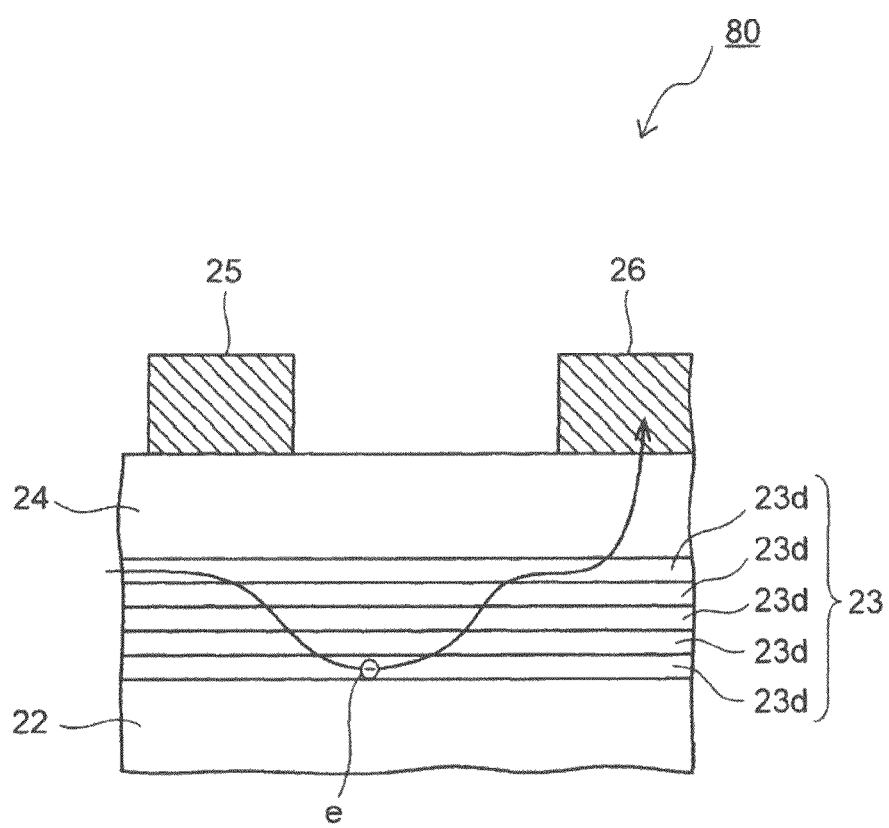
FIG. 26 is a drawing illustrating the compound semiconductor device of the sixth embodiment in operation.

FIG. 26 is a drawing illustrating the compound semiconductor device 80 in operation.

As illustrated in FIG. 26, when the compound semiconductor device 80 is in operation, the two dimensional electron "e" passes through a deep portion of the channel layer 23 due to a high electric field from the drain electrode 26. Although the band gap of the deep portion of the channel layer 23 is wide as described above, a material with a wide band gap is less likely to be damaged even if high-energy electrons pass through the material.

Accordingly, the sixth embodiment makes it possible to prevent the channel layer 23 from being damaged by high-energy electrons exposed to a high electric field, and thereby makes it possible to improve the reliability of the compound semiconductor device 80.

The materials and the composition ratios of the well layers 23d are not limited to those described above, and the well layers 23d may be formed of any material whose band gap can be made wider by adjusting the composition ratio of a component in the material depending on the position relative to the substrate 21.

For example, a GaN layer may be formed as the uppermost well layer 23d, and InGaN layers may be formed as well layers 23d below the uppermost well layer 23d. In this case, the band gap of the well layers 23d can be made wider by decreasing the composition ratio of In in the InGaN layers, and the InGaN layers are arranged in descending order of the composition ratios of In in a direction toward the substrate 21.

<Seventh Embodiment>

A seventh embodiment provides a discrete package including one of the compound semiconductor devices 30, 40, 50, 60, 70, and 80 described in the first through sixth embodiments.

Figure 27:
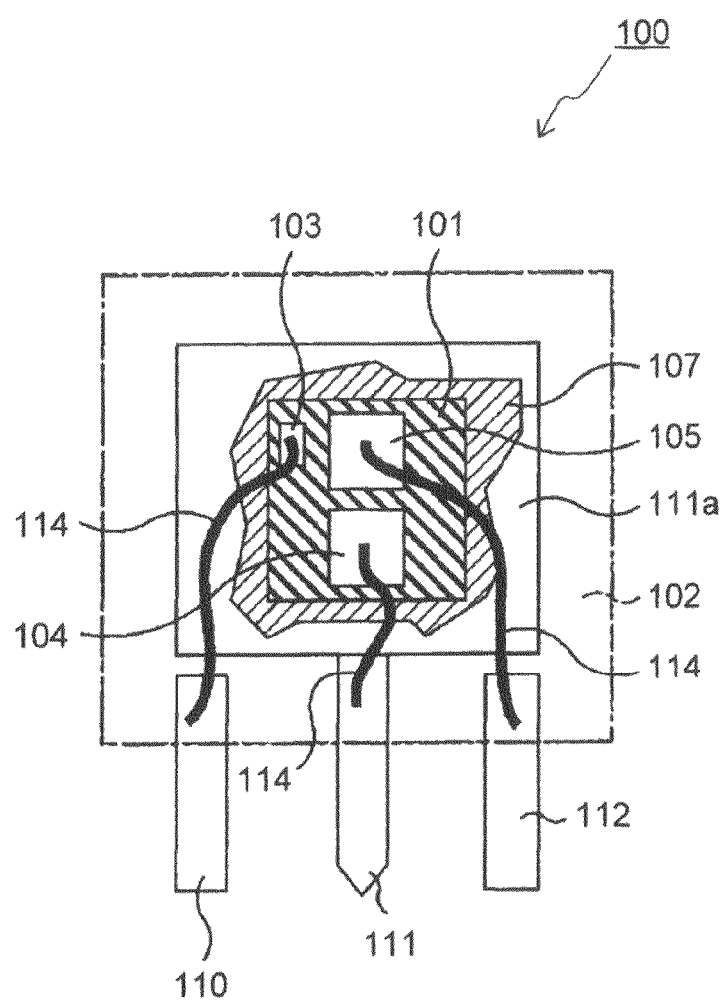
FIG. 27 is a plan view of a discrete package according to a seventh embodiment.

FIG. 27 is a plan view of a discrete package 100 according to the seventh embodiment.

The discrete package 100 includes a HEMT chip 101 including the compound semiconductor device 30 (FIG. 5) of the first embodiment and a resin 102 for sealing the HEMT chip 101. Instead of the compound semiconductor device 30, any one of the compound semiconductor devices 40, 50, 60, 70, and 80 of the second through sixth embodiments may be used.

The HEMT chip 101 includes a gate pad 103, a drain pad 104, and a source pad 105. The gate pad 103, the drain pad 104, and the source pad 105 are electrically connected via wire (not shown) to the gate electrode 27, the drain electrode 26, and the source electrode 25, respectively.

Portions of a gate lead 110, a drain lead 111, and a source lead 112 are embedded in the resin 102. The drain lead 111 includes a square land 111a, and the HEMT chip 101 is bonded via a die attachment material 107 to the land 111a.

The gate lead 110, the drain lead 111, and the source lead 112 are electrically connected via metal wires 114 such as aluminum wires to the gate pad 103, the drain pad 104, and the source pad 105, respectively.

The electron velocity in the compound semiconductor device 30 included in the HEMT chip 101 is high as described above. Accordingly, the seventh embodiment makes it possible to provide the discrete package 100 where the drain current is high and a current gain cutoff frequency ft and a maximum oscillation frequency fmax are improved.

<Eighth Embodiment>

An eighth embodiment provides a power factor correction (PFC) circuit using the HEMT chip 101 of the seventh embodiment.

Figure 28:
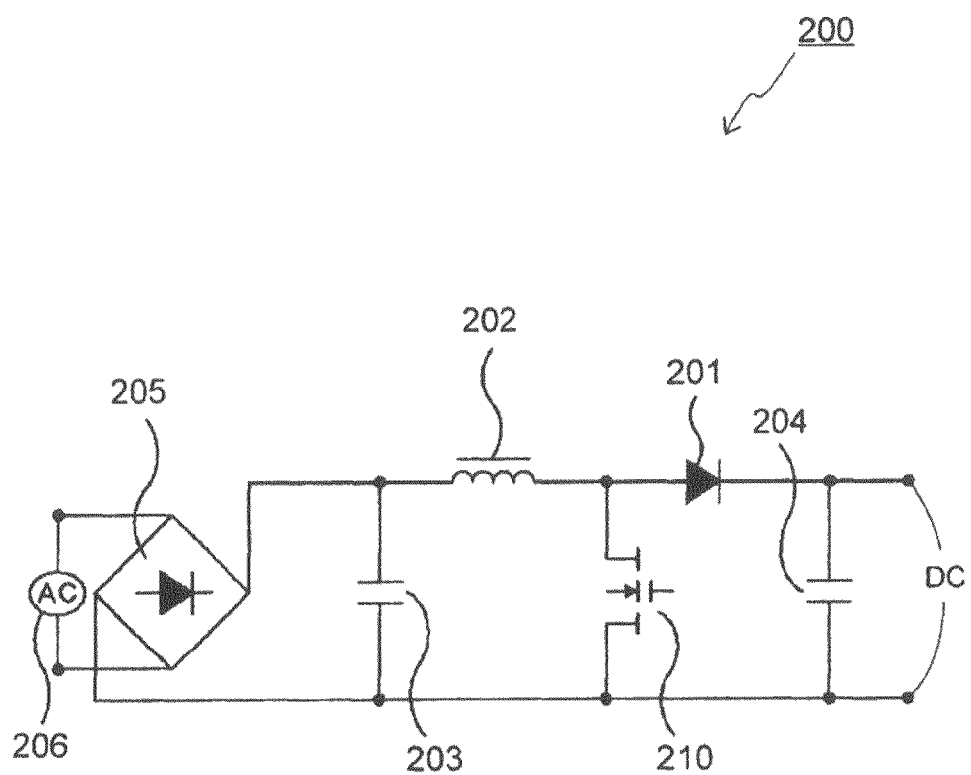
FIG. 28 is a circuit diagram of a PFC circuit according to an eighth embodiment.

FIG. 28 is a circuit diagram of a PFC circuit 200 of the eighth embodiment.

As illustrated in FIGS. 18A and 18B, the PFC circuit 200 includes a diode 201, a choke coil 202, capacitors 203 and 204, a diode bridge 205, an alternating-current power supply 206, and a switching device 210.

The switching device 210 is implemented by the HEMT chip 101 of the seventh embodiment. The drain electrode of the switching device 210 is connected to the anode of the diode 201 and a terminal of the choke coil 202.

The source electrode of the switching device 210 is connected to a terminal of the capacitor 203 and a terminal of the capacitor 204.

A gate driver (not shown) is connected to the gate electrode of the switching device 210.

Also, another terminal of the capacitor 203 is connected to another terminal of the choke coil 202, and another terminal of the capacitor 204 is connected to the cathode of the diode 201.

Further, the alternating-current power supply 206 is connected via the diode bridge 205 to the terminals of the capacitor 203, and a direct-current power supply DC is connected to the terminals of the capacitor 204.

<Ninth Embodiment>

A ninth embodiment provides a power supply device using the HEMT chip 101 of the seventh embodiment and the PFC circuit 200 of the eighth embodiment.

Figure 29:
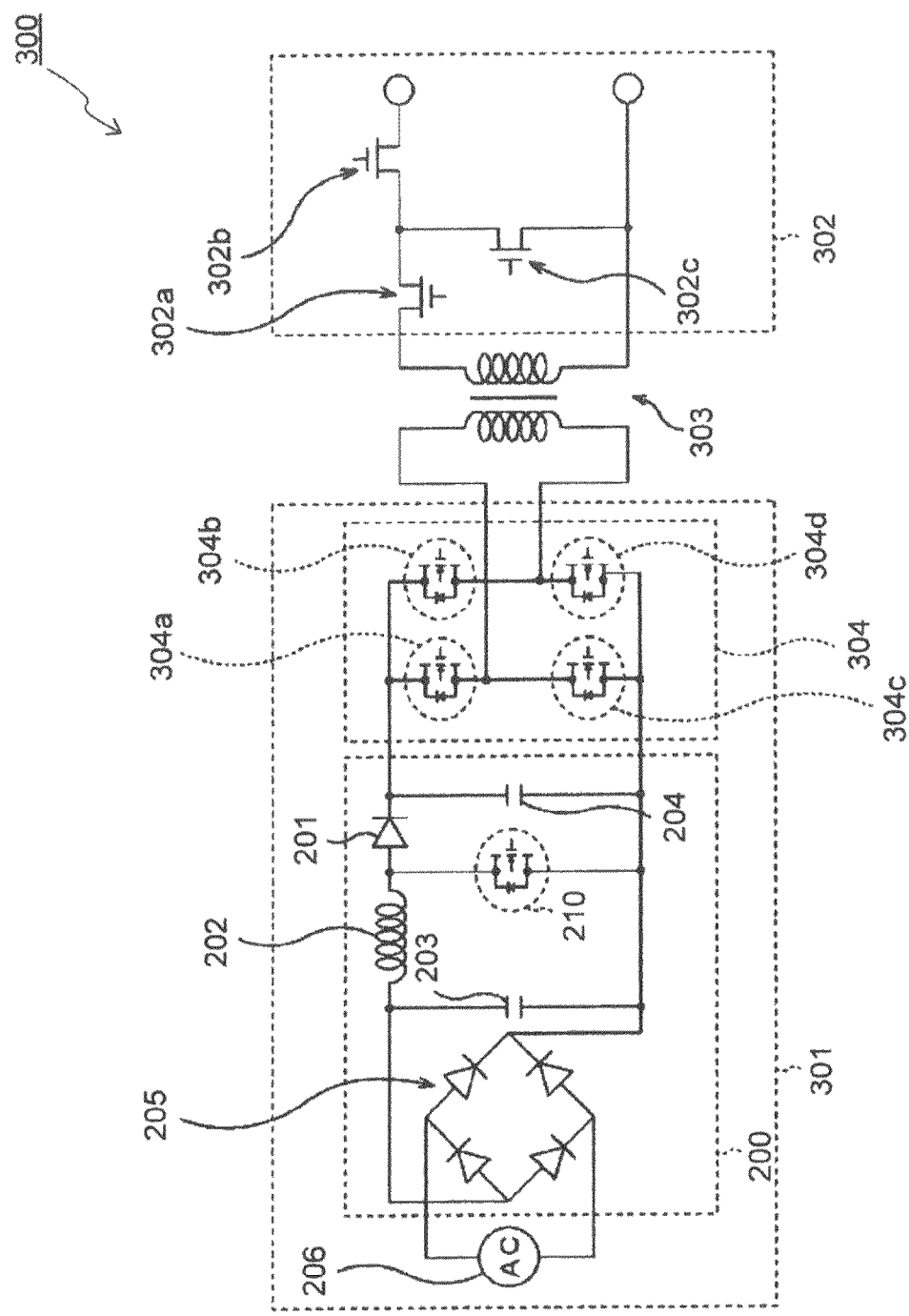
FIG. 29 is a circuit diagram of a power supply device according to a ninth embodiment.

FIG. 29 is a circuit diagram of a power supply device 300 of the ninth embodiment. The same reference numbers as those assigned to components described in the eighth embodiment are assigned to the corresponding components in FIG. 29, and descriptions of those components are omitted here.

As illustrated in FIG. 29, the power supply device 300 includes a high-voltage primary circuit 301, a low-voltage secondary circuit 302, and a transformer 303 disposed between the primary circuit 301 and the secondary circuit 302.

The primary circuit 301 includes the PFC circuit 200 of the eighth embodiment and a full-bridge inverter circuit 304 connected to the terminals of the capacitor 204 of the PFC circuit 200.

The full-bridge inverter circuit 304 includes switching devices 304a, 304b, 304c, and 304d. Each of the switching devices 304a, 304b, 304c, and 304d is implemented by the HEMT chip 101 of the seventh embodiment.

The secondary circuit 302 includes switching devices 302a, 302b, and 302c. Each of the switching devices 302a, 302b, and 302c may be implemented by, for example, a metal insulator semiconductor field effect transistor (MISFET) where a channel is formed in a silicon substrate.

In the ninth embodiment, each of the switching devices 210, 304a, 304b, 304c, and 304d is implemented by the HEMT chip 101. In the HEMT chip 101, the drain current is high, and high frequency characteristics such as a current gain cutoff frequency ft and a maximum oscillation frequency fmax are improved. Accordingly, the ninth embodiment makes it possible to provide the high-frequency power supply device 300 suitable for high power applications.

<Tenth Embodiment>

A tenth embodiment provides a high-frequency amplifier using the HEMT chip 101 of the seventh embodiment.

Figure 30:
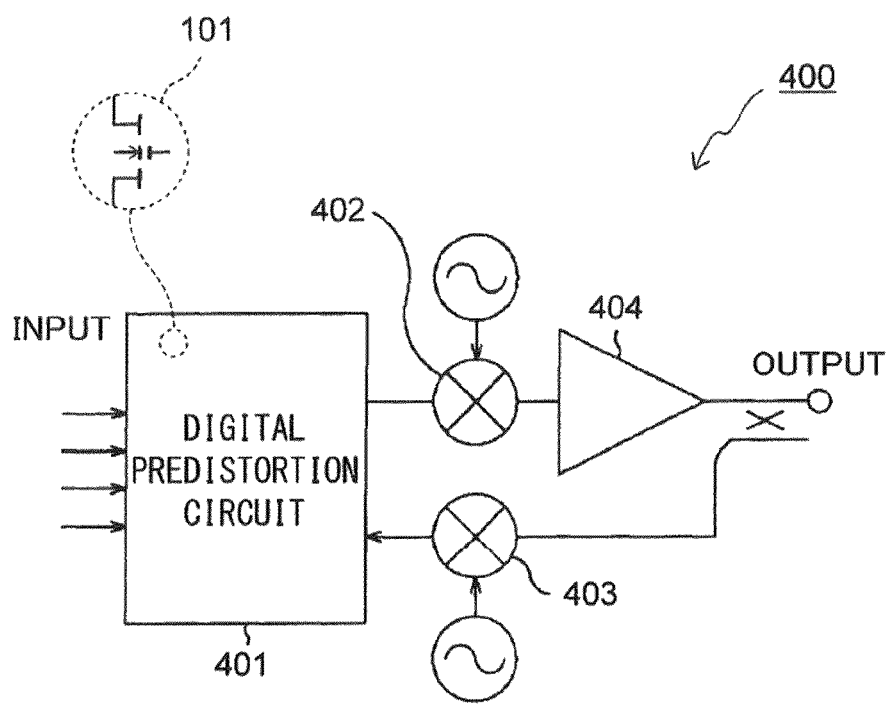
FIG. 30 is a circuit diagram of a high frequency amplifier according to a tenth embodiment.

FIG. 30 is a circuit diagram of a high-frequency amplifier 400 of the tenth embodiment.

As illustrated in FIG. 30, the high-frequency amplifier 400 includes a digital predistortion circuit 401, mixers 402 and 403, and a power amplifier 404.

The digital predistortion circuit 401 compensates for the nonlinear distortion of an input signal. The mixer 402 mixes the input signal whose non-linear distortion is compensated for with an alternating current signal.

The power amplifier 404 includes the HEMT chip 101 and amplifies the input signal mixed with the alternating current signal. In the tenth embodiment, an output signal can be switched to the mixer 403 and mixed with an alternating-current signal by the mixer 403, and the mixed signal can be output to the digital predistortion circuit 401.

The drain current and high-frequency characteristics of the HEMT chip 101 included in the power amplifier 404 are improved as described above. Accordingly, the tenth embodiment makes it possible to provide the high-frequency amplifier 400 suitable for high power applications.

According to the embodiments described above, multiple energy levels are formed in a channel layer due to its quantum well structure. With this configuration, an electron in an energy level transitions to an upper energy level instead of transitioning to a point L in the same energy level, and unlike a case where the electron transitions to the point L, the effective mass of the electron does not increase. This results in increased electron velocity, and makes it possible to increase the power of a compound semiconductor device.

All examples and conditional language provided herein are intended for the pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A compound semiconductor device, comprising:
   a substrate;
   a buffer layer that is a compound semiconductor layer formed over the substrate;
   a channel layer formed over the buffer layer;
   an electron supply layer formed over the channel layer; and
   a source electrode, a drain electrode, and a gate electrode that are formed apart from each other over the electron supply layer, wherein
   a quantum well structure is formed by the buffer layer, the channel layer, and the electron supply layer; and
   an energy difference between a ground level and a second excited level of an electron in the channel layer is greater than an optical phonon energy of the channel layer.

2. The compound semiconductor device as claimed in claim 1, wherein the energy difference between the ground level and the second excited level of the electron in the channel layer is less than an energy difference between a point L and a point Γ in a subband corresponding to the ground level.

3. The compound semiconductor device as claimed in claim 1, wherein a surface layer of the buffer layer is doped with a donor impurity.

4. The compound semiconductor device as claimed in claim 1, wherein
   the channel layer includes
      a lower layer formed on the buffer layer,
      a middle layer formed on the lower layer, and
      an upper layer formed on the middle layer; and
      electron affinities of the lower layer and the upper layer are smaller than an electron affinity of the middle layer.

5. The compound semiconductor device as claimed in claim 4, wherein
   the middle layer is a GaN layer; and
   the lower layer and the upper layer are AlGaN layers.

6. The compound semiconductor device as claimed in claim 1, wherein
   the channel layer includes multiple well layers that are stacked on each other and have band gaps with different widths; and
   the well layers are arranged in ascending order of the widths of the band gaps in a direction toward the substrate.

7. The compound semiconductor device as claimed in claim 6, wherein
   the well layers include at least one upper well layer and two or more lower well layers, the lower well layers being closer to the substrate than the upper well layer;
   the lower well layers are AlGaN layers having different composition ratios of Al; and
   the AlGaN layers are arranged in ascending order of the composition ratios of Al in the direction toward the substrate.

8. The compound semiconductor device as claimed in claim 6, wherein the well layers include at least one upper well layer and two or more lower well layers, the lower well layers being closer to the substrate than the upper well layer;

the lower well layers are InGaN layers having different composition ratios of In; and the InGaN layers are arranged in descending order of the composition ratios of In in the direction toward the substrate.

9. The compound semiconductor device as claimed in claim 1, wherein a thickness of the channel layer is less than or equal to 15 nm.

10. The compound semiconductor device as claimed in claim 1, wherein a surface roughness of the buffer layer is less than or equal to 0.4 nm.

11. The compound semiconductor device as claimed in claim 1, wherein each of the buffer layer, the channel layer, and the electron supply layer is comprised of a nitride semiconductor.

12. A power supply device, comprising:

a compound semiconductor device that includes a substrate, a buffer layer that is a compound semiconductor layer formed over the substrate, a channel layer formed over the buffer layer, an electron supply layer formed over the channel layer, and a source electrode, a drain electrode, and a gate electrode that are formed apart from each other over the electron supply layer, wherein a quantum well structure is formed by the buffer layer, the channel layer, and the electron supply layer; and an energy difference between a ground level and a second excited level of an electron in the channel layer is greater than an optical phonon energy of the channel layer.

13. A high-frequency amplifier, comprising:

a compound semiconductor device that includes a substrate, a buffer layer that is a compound semiconductor layer formed over the substrate, a channel layer formed over the buffer layer, an electron supply layer formed over the channel layer, and a source electrode, a drain electrode, and a gate electrode that are formed apart from each other over the electron supply layer, wherein a quantum well structure is formed by the buffer layer, the channel layer, and the electron supply layer; and an energy difference between a ground level and a second excited level of an electron in the channel layer is greater than an optical phonon energy of the channel layer.

* * * * *